United States Patent
Kim et al.

(10) Patent No.: US 11,429,838 B2
(45) Date of Patent: Aug. 30, 2022

(54) NEURAL NETWORK DEVICE FOR NEURAL NETWORK OPERATION, METHOD OF OPERATING NEURAL NETWORK DEVICE, AND APPLICATION PROCESSOR INCLUDING THE NEURAL NETWORK DEVICE

(71) Applicant: SAMSUNG ELECTRONICS CO., LTD., Suwon-si (KR)

(72) Inventors: Hyun-Pil Kim, Seoul (KR); Seong-Woo Ahn, Yongin-si (KR); Jong-Hyup Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 361 days.

(21) Appl. No.: 16/547,495

(22) Filed: Aug. 21, 2019

(65) Prior Publication Data
US 2020/0167632 A1 May 28, 2020

(30) Foreign Application Priority Data

Nov. 23, 2018 (KR) .................. 10-2018-0146610

(51) Int. Cl.
| | |
|---|---|
| G06N 3/04 | (2006.01) |
| G06N 3/08 | (2006.01) |
| H03M 7/24 | (2006.01) |
| G06F 5/01 | (2006.01) |
| G06F 13/28 | (2006.01) |
| G06F 7/487 | (2006.01) |

(52) U.S. Cl.
CPC .............. *G06N 3/04* (2013.01); *G06F 5/012* (2013.01); *G06F 7/4876* (2013.01); *G06F 13/28* (2013.01); *G06N 3/08* (2013.01); *H03M 7/24* (2013.01)

(58) Field of Classification Search
CPC ......... G06F 5/012; G06F 7/4876; G06N 3/04; G06N 3/08
See application file for complete search history.

(56) References Cited

U.S. PATENT DOCUMENTS

| | | | |
|---|---|---|---|
| 9,449,271 | B2 | 9/2016 | Wang et al. |
| 9,836,692 | B1 | 12/2017 | Gulland |
| 10,007,876 | B1 | 6/2018 | Young |
| 2016/0328646 | A1 | 11/2016 | Lin et al. |
| 2017/0308789 | A1* | 10/2017 | Langford ............... G06N 7/005 |
| 2017/0316312 | A1 | 11/2017 | Goyal et al. |
| 2018/0032866 | A1 | 2/2018 | Son et al. |

(Continued)

FOREIGN PATENT DOCUMENTS

| | | |
|---|---|---|
| JP | 2018055514 | 4/2018 |
| KR | 1020180013674 | 2/2018 |

*Primary Examiner* — Michael D. Yaary
(74) *Attorney, Agent, or Firm* — Volentine, Whitt & Francos, PLLC

(57) ABSTRACT

Provided are a neural network device for performing a neural network operation, a method of operating the neural network device, and an application processor including the neural network device. The neural network device includes a direct memory access (DMA) controller configured to receive floating-point data from a memory; a data converter configured to convert the floating-point data received through the DMA controller to integer-type data; and a processor configured to perform a neural network operation based on an integer operation by using the integer-type data provided from the data converter.

19 Claims, 21 Drawing Sheets

(56) References Cited

U.S. PATENT DOCUMENTS

| | | |
|---|---|---|
| 2018/0046903 A1 | 2/2018 | Yao et al. |
| 2018/0046913 A1 | 2/2018 | Yu et al. |
| 2018/0096246 A1 | 4/2018 | Yamamoto et al. |
| 2018/0121789 A1 | 5/2018 | Ouyang et al. |
| 2019/0294413 A1* | 9/2019 | Vantrease ............... G06F 17/15 |

* cited by examiner

<Floating Point Format>

<Integer Format>

<Fixed Point Format>

FIG. 8B

| IN_A(FP) : | Sa | Exponent A (Ea) | Fraction A (Fa) |
| IN_B(FP) : | Sb | Exponent B (Eb) | Fraction B (Fb) |
| IB_C(FP) : | Sc | Exponent C (Ec) | Fraction C (Fc) |

<Dequantized INT to FP Conversion>

FIG. 9B

| IN_A(FP) : | Sa | Exponent A (Ea) | Fraction A (Fa) |
| IN_B(INT) : | | INTEGER B (INTb) | |
| IB_C(FP) : | Sc | Exponent C (Ec) | Fraction C (Fc) |

⬇ IN_B (Signed char) : Sb=MSB, Eb=7, Fb[7:0] = (INTb)

| IN_A(FP) : | Sa | Exponent A (Ea) | Fraction A (Fa) |
| IN_B(FP) : | Sb | Exponent B (Eb) | Fraction B (Fb) |
| IB_C(FP) : | Sc | Exponent C (Ec) | Fraction C (Fc) |

<Integer MAC Operation>

<INT to FP Conversion>

NEURAL NETWORK DEVICE FOR NEURAL NETWORK OPERATION, METHOD OF OPERATING NEURAL NETWORK DEVICE, AND APPLICATION PROCESSOR INCLUDING THE NEURAL NETWORK DEVICE

CROSS-REFERENCE TO RELATED APPLICATION

This U.S. non-provisional patent application claims the benefit of priority under 35 U.S.C. § 119 to Korean Patent Application No. 10-2018-0146610, filed on Nov. 23, 2018 in the Korean Intellectual Property Office, the disclosure of which is incorporated herein in its entirety by reference.

BACKGROUND

1. Field of the Disclosure

The present disclosure relates to a neural network. More particularly, the present disclosure relates to a method and apparatus for processing a floating-point number through a neural network device which includes an integer operator.

2. Description of the Related Art

A neural network refers to a computational architecture that models a biological network that constitutes the brain of an animal. Recently, along with the development of neural network technology, research is being actively conducted into analyzing input data and extracting valid information by using a neural network device based on a neural network in various types of electronic systems.

A neural network device requires a large amount of operations for complex input data. A neural network device requires a technique for efficiently processing neural network operations to analyze inputs such as input data in real time and extract information therefrom. Particularly, a low-power and high-performance system, such as a smartphone, has limited resources, and thus techniques for maximizing the performance of an artificial neural network while reducing the amount of operations required to process complex input data are required.

Separately, floating-point numbers are used as a particular way of encoding numbers. A floating-point number may include a signed digit string of a given length in a given base and a signed integer exponent that modifies magnitude. The use of floating-point numbers provides an approximation of the underlying numbers in a way that trades off range and preciseness. That is, a floating-point number may support a wide range of values and may be suitable for representing an approximation of a real number. However, a floating-point number as a representation may present relative complexity compared to more familiar real numbers. For example, floating-point data may include a feature map, a kernel (a weight map), a bias, etc., and the nature of processing such floating-point data is not always optimal for a neural network device.

SUMMARY

The present disclosure describes a method and apparatus for processing a floating-point number of a neural network in a neural network device which includes an integer operator.

According to an aspect of the present disclosure, a neural network device for performing a neural network operation includes a direct memory access (DMA) controller, a data converter and a processor. The direct memory access controller is configured to receive floating-point data from a memory. The data converter is configured to convert the floating-point data received through the DMA controller to integer-type data. The processor is configured to perform a neural network operation based on an integer operation by using the integer-type data provided from the data converter.

According to another aspect of the present disclosure, a method of operating a neural network device includes receiving floating-point input data from a memory and converting the floating-point input data to integer-type input data. The method also includes performing a neural network operation based on an integer operation by using the integer-type input data.

According to another aspect of the present disclosure, an application processor includes a memory and a neural network device. The memory is configured to store operation parameters and feature values. The operation parameters and the features values are floating-point type values. The neural network device is configured to receive the operation parameters and the feature values from the memory, convert the operation parameters and the feature values to integer-type values, and perform a neural network operation based on the operation parameters and the feature values that are converted to integer-type values.

BRIEF DESCRIPTION OF THE DRAWINGS

Embodiments of the present disclosure will be more clearly understood from the following detailed description taken in conjunction with the accompanying drawings in which:

FIG. 8B is a diagram showing the inputs of the data converter of FIG. 8A;

FIG. 9B is a diagram showing inputs of the data converter of FIG. 9A;

DETAILED DESCRIPTION OF THE EMBODIMENTS

Figure 1:
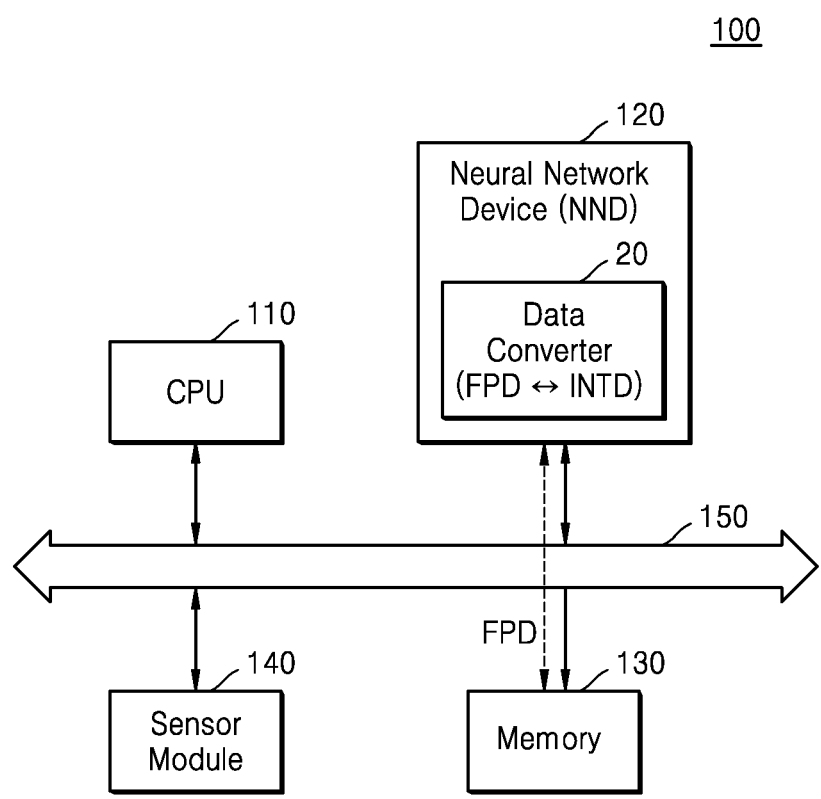
FIG. 1 is a block diagram illustrating a neural network system according to an example embodiment.

FIG. 1 is a block diagram illustrating a neural network system according to an example embodiment.

A neural network system 100 may infer information included in or derivable from input data by training (or learning) a neural network or by analyzing the input data by using the neural network. The neural network system 100 may determine how to resolve or proceed in a situation based on inferred information or may control components of an electronic device on which the neural network system 100 is installed. For example, the neural network system 100 may be applied to or in a smart phone, a tablet device, a smart TV, an augmented reality (AR) device, an Internet of Things (IoT) device, an autonomous driving vehicle, a robot, a medical device, a drone, an advanced drivers assistance system (ADAS), an image display device, a measuring device and/or other types of devices. For example, the neural network system 100 may be applied to perform voice recognition, image recognition, image classification and/or other operations using neural networks. The neural network system 100 may also be installed on any one of various types of electronic devices. In an example embodiment, the neural network system 100 of FIG. 1 may be an application processor.

Referring to FIG. 1, the neural network system 100 may include a CPU 110 (central processing unit), a neural network device 120, a memory 130, and a sensor module 140. The neural network system 100 may further include an input/output module, a security module, a power control device, etc., and may further include various types of processors. Some or all of the components of the neural network system 100 (e.g., the CPU 110, the neural network device 120, the memory 130, and the sensor module 140) may be formed on a single semiconductor chip. For example, the neural network system 100 may be implemented as a system-on-chip (SoC). The components of the neural network system 100 may communicate with one another via a bus 150.

The CPU 110 controls all operations of the neural network system 100. The CPU 110 may include one processing core (single core) or multiple processing cores (multi-core). The CPU 110 may process or execute programs and/or data stored in a storage area like the memory 130. The CPU 110 may perform or control performance of part or all of various methods described herein by executing instructions in such programs and/or data. The CPU 110 may also be or include an integer operator and perform an integer operation based on integer-type input values converted from floating-point input values by the data converter 20. Alternatively, the CPU 110 may control a processor in the neural network device 120 as an integer operator to perform an integer operation based on integer-type input values converted from floating-point input values by the data converter 20.

For example, the CPU 110 may control the neural network device 120 to execute an application program and perform neural network-based tasks demanded in association with the execution of the application program. A neural network includes at least one of various types of neural network models including a convolution neural network (CNN), a region with convolution neural network (R-CNN), a region proposal network (RPN), a recurrent neural network (RNN), a stacking-based deep neural network (S-DNN), a state-space dynamic neural network (S-SDNN), a deconvolution network, a deep belief network (DBN), a restricted Boltzmann machine (RBM), a fully convolutional network, a long short-term memory (LSTM) network, and a classification network.

The neural network device 120 may perform a neural network operation based on received input data. For example, a neural network operation may include convolution, pooling, an activation function operation, a vector operation, a dot product operation, a cross product operation, etc. Furthermore, the neural network device 120 may generate an information signal based on a result of a neural network operation. The neural network device 120 may be implemented as a neural network operation accelerator, a co-processor, a digital signal processor (DSP), or an application-specific integrated circuit (ASIC).

The neural network device 120 according to the present embodiment may include an integer operator and may perform a neural network operation based on an integer operation. The integer operator may operate on integers or fixed-point numbers. The integer operator may exhibit lower power consumption, faster processing speed, and smaller circuit area as compared to a floating-point operator that performs floating-point operations.

However, a neural network may include floating-point data represented by real numbers, e.g., floating-point numbers. The neural network device 120 may include such floating-point data by receiving, generating, retrieving or otherwise obtaining the floating-point data. For example, floating-point data may include a feature map, a kernel (a weight map), a bias, etc. As described previously herein, a floating-point number may support a wide range of values and may be suitable for representing an approximation of a real number. The integer operator may not easily process floating-point data in one or more embodiments. Therefore, the neural network device 120 according to the present embodiment may include a data converter 20 for processing floating-point data. The data converter 20 may perform data conversion between floating-point data and integer-type data. In other words, the data converter 20 may convert a floating-point number to an integer (or a fixed-point number), or an integer to a floating-point number. The data converter 20 may include multiple floating-point operators and shifters that are selectively deactivated and activated. Deactivation and activation may be performed according to a received operation code, for example, so that the activated floating-point operators and/or shifters perform an operation mode according to the operation code.

The neural network device 120 may receive floating-point data FPD stored in the memory 130 and convert the floating-point data FPD to integer-type data INTD by using the data converter 20. The neural network device 120 may perform a neural network operation based on the integer-type data INTD using components other than the data converter 20 and store a result of the neural network operation in the memory 130. At this time, the result of the neural network operation may be generated by and output as integer-type data INTD, that is, integer-type output data. The data converter 20 may convert integer-type data INTD generated by and output from other components of the neural network device 120, and passed to the data converter 20, to floating-point data FPD. The neural network device 120 may store floating point data FPD generated by the data converter 20 in the memory 130. In an example embodiment, the neural network device 120 may transmit and receive the floating-point data FPD to and from the memory 130 via the bus 150 without an intervention of the CPU 110, or at least independent of processing of or for the floating-point data by the CPU 110. In other words, the floating-point data FPD may be transmitted and received directly between the neural network device 120 and the memory 130. In embodiments explained later, the direct transmission and receipt of the floating-point data FPD may be in accordance with DMA (direct memory access), which is a mechanism of providing access to a main memory such as a random-access memory independent of a CPU such as the CPU 110. In other words, the direct transmission and receipt described herein may be an exception to the overall operation of the neural network system 100, and particularly to the overall operation of the CPU 110 and the memory 130.

The memory 130 may store programs and/or data used in the neural network system 100. The memory 130 may also store operation parameters, quantization parameters, input data and output data. Examples of operation parameters include, weight values, bias values, etc. for a neural network. Examples of quantization parameters for quantization of the neural network include scale factors, bias values, etc., and hereinafter may be referred to as quantization parameters, An example of input data is an input feature map), and an example of output data is an output feature map. The operation parameters, the quantization parameters, the input data, and the output data may be floating point data FPD.

The memory 130 may be dynamic random access memory (DRAM), but the memory 130 is not limited thereto. The memory 130 may include at least one of a volatile memory and a non-volatile memory. Examples of non-volatile memory include read only memory (ROM), programmable ROM (PROM), electrically programmable ROM (EPROM), electrically erasable and programmable ROM (EEPROM), a flash memory, phase-change RAM (PRAM), magnetic RAM (MRAM), resistive RAM (RRAM), ferroelectric RAM (FRAM), etc. Examples of volatile memory include DRAM, static RAM (SRAM), synchronous DRAM (SDRAM), etc. In example embodiments, the memory 130 may include at least one of a hard disk drive (HDD), a solid state drive (SSD), a compact flash (CF) card, a secure digital (SD) card, a micro secure digital (Micro-SD) card, a mini secure digital (Mini-SD) card, an extreme digital (xD) card, and a memory stick.

The sensor module 140 may collect information regarding an electronic device on which the neural network system 100 is installed. The sensor module 140 may sense or receive a signal (e.g., a video signal, a voice signal, a magnetic signal, a biological signal, a touch signal, etc.) from the outside of the electronic device and convert the sensed or received signal to sensing data. To this end, the sensor module 140 may include at least one of various types of sensing devices, e.g., a microphone, an imaging device, an image sensor, a light detection and ranging (LIDAR) sensor, an ultrasonic sensor, an infrared sensor, a biosensor, a touch sensor, etc. Examples of signals that may be received by the sensor module 140 included addressed signals that are specifically sent to a unique address of the electronic device on which the neural network system 100 is installed, or an address of a component of the electronic device. Examples of signals that may be sensed by the sensor module 140 included electronic information derivable from monitoring the environment around the electronic device, such a by a camera, a microphone, a biological sensor, a touch sensor such as a screen or keyboard, and so on.

Sensing data may be considered data sensed or received by the sensor module 140, and may be provided as input data to the neural network device 120 or stored in the memory 130. Sensing data stored in the memory 130 may be provided to the neural network device 120. In an example embodiment, the neural network device 120 may further include a graphics processing unit (GPU) for processing image data, wherein sensing data may be processed by the GPU and then stored in the memory 130 or provided to the neural network device 120.

For example, the sensor module 140 may include an image sensor and may generate image data by capturing an image of the environment outside the electronic device. Image data output from the sensor module 140 or image data processed by the GPU may be floating point data, and the image data may be provided directly to the neural network device 120 or provided to the neural network device 120 after being stored in the memory 130.

Figure 2:
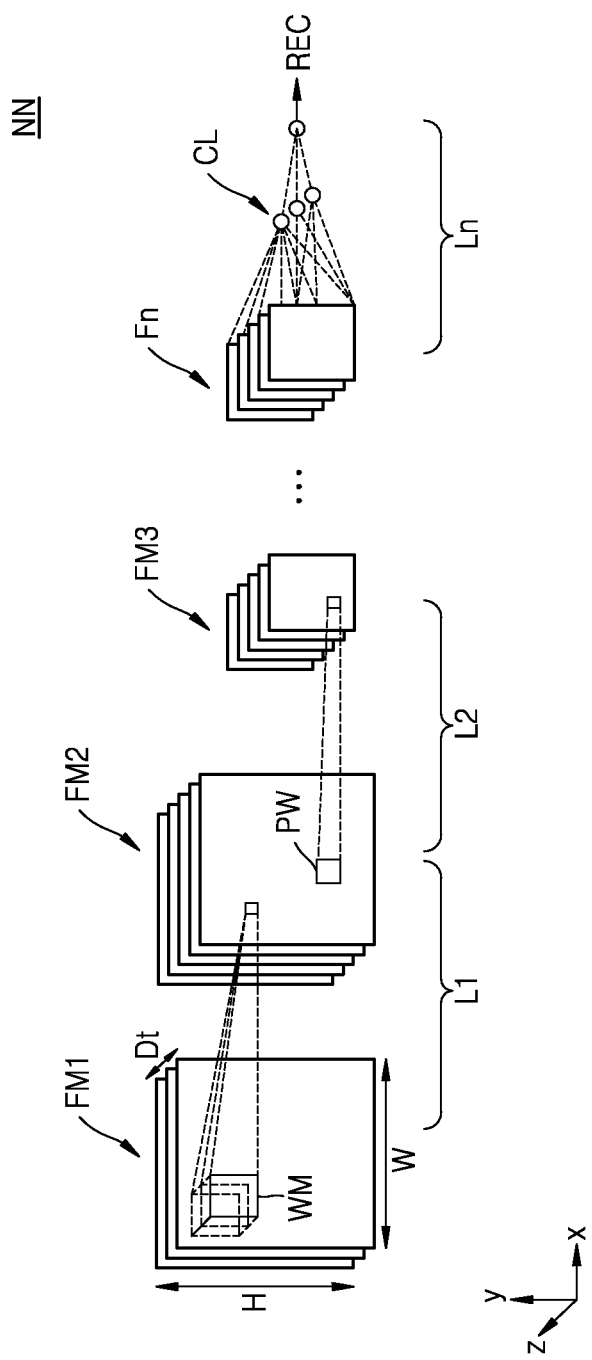
FIG. 2 is a diagram showing an example of a neural network structure.

FIG. 2 is a diagram showing an example of a neural network structure. Referring to FIG. 2, a neural network NN may include multiple layers L1 to Ln. Such a neural network having a multi-layered structure may be referred to as a deep neural network (DNN) or a deep learning architecture. Each of the layers L1 to Ln may be a linear layer or a non-linear layer. In an example embodiment, at least one linear layer and at least one non-linear layer may be combined with each other and referred to as one layer. For example, a linear layer may include a convolutional layer and a fully connected layer, whereas a non-linear layer may include a pooling layer and an activation layer.

For example, a first layer L1 may be a convolution layer, a second layer L2 may be a pooling layer, and an n-th layer Ln may be an output layer and a fully connected layer. The neural network NN may further include an activation layer and may further include layers that perform other types of operations.

Each of the layers L1 to Ln may receive an input image frame or a feature map generated in a previous layer as an input feature map, operate on the input feature map, and generate an output feature map or a recognition signal REC. At this time, a feature map refers to data in which various features of input data are expressed. Each of the feature maps FM1, FM2, FM3, and FMn may have, for example, a 2-dimensional matrix structure or a 3-dimensional matrix (or a tensor) structure including multiple feature values. Each of the feature maps FM1, FM2, FM3, and FMn may have a width W (or a column), a height H (or a row) and a depth Dt, wherein the width W, the height H, and the depth Dt may correspond to the x-axis, the y-axis, and the z-axis of a coordinate system, respectively. At this time, the depth Dt may be referred to as a channel number.

The first layer L1 may generate a second feature map FM2 by convolving a first feature map FM1 with a weight map WM. The weight map WM may have a 2-dimensional matrix structure or a 3-dimensional matrix structure including multiple weight values. The weight map WM may be referred to as a kernel. The weight map WM may filter the first feature map FM1 and may be referred to as a filter or a kernel. The depth of the weight map WM, i.e., the number of channels, is equal to the depth of the first feature map FM1, i.e., the number of channels, and channels of the weight map WM may be convolved with the same channels of the first feature map FM1. The weight map WM is shifted to traverse the first input feature map FM1 as a sliding window. During each shift, each of the weights in the weight map WM may be multiplied by and added to all feature values in a region overlapping the first feature map FM1. As the first feature map FM1 and the weight map WM are convolved, one channel of a second feature map FM2 may be generated. Although only one weight map WM is shown in FIG. 2, multiple channels of the second feature map FM2 may be generated as multiple weight maps are convolved with the first feature map FM1. In other words, the number of channels of the second feature map FM2 may correspond to the number of weight maps.

A second layer L2 may generate a third feature map FM3 by changing the spatial size of the second feature map FM2 through pooling. The pooling may also be referred to as sampling or down-sampling. A 2-dimensional pooling window PW is shifted on the second feature map FM2 in units of the size of the pooling window PW, and a maximum value (or an average value of feature values) may be selected from among feature values in a region overlapping the pooling window PW. Accordingly, the third feature map FM3 having a spatial size changed from that of the second feature map FM2 may be generated. The number of channels of the third feature map FM3 is identical to that of the second feature map FM2.

An n-th layer Ln may classify a class CL of input data by combining features of an n-th feature map FMn. Also, the n-th layer Ln may generate a recognition signal REC corresponding to a class. For example, when input data is image data and the neural network NN performs image recognition, the n-th layer Ln may recognize an object by extracting a class corresponding to the object of an image indicated by the image data based on the n-th feature map FMn provided from a previous layer and generate the recognition signal REC corresponding to the recognized object.

As described above with reference to FIG. 2, neural networks such as the neural network NN may be implemented with a complicated architecture. A neural network device performing neural network operations may perform a very large number of operations ranging from hundreds of millions to tens of billions of operations. Accordingly, neural network systems such as the neural network system 100 in FIG. 1 may have a neural network device 120 perform integer operations. According to example embodiments, the neural network device 120 performs an integer operation, and thus power consumption and a circuit area may be reduced as compared to a neural network device performing a floating-point operation. As a result, processing speed may be improved for neural network systems such as the neural network system 100 in FIG. 1.

Figure 3A:
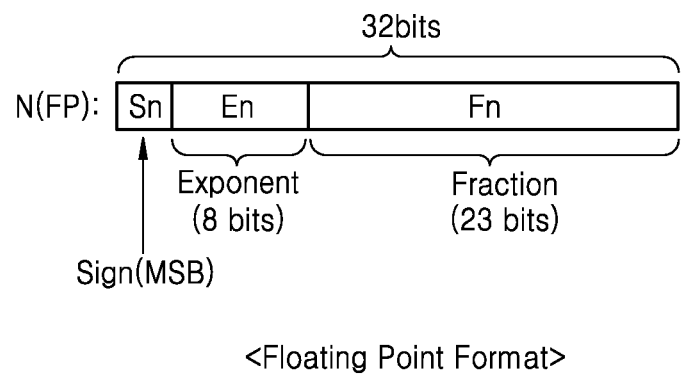
FIG. 3A is a diagram illustrating an example of a floating-point number.
Figure 3B:
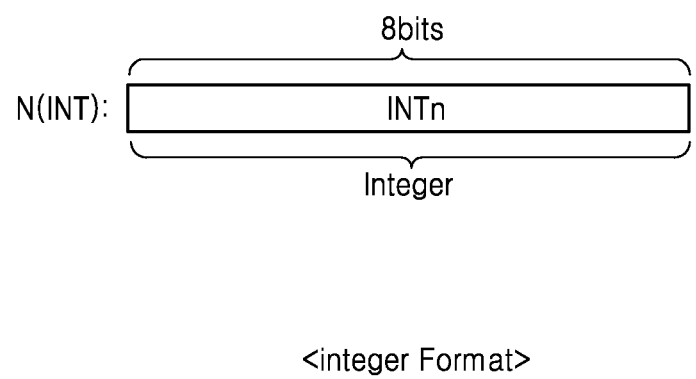
FIG. 3B is a diagram illustrating an example of an integer.
Figure 3C:
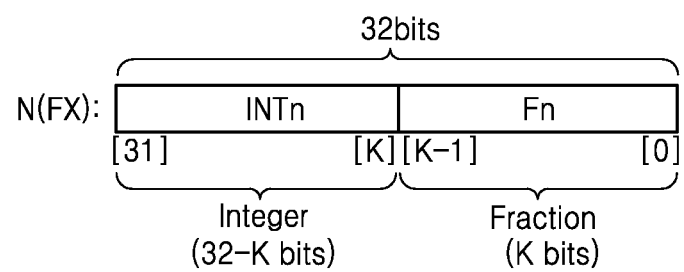
FIG. 3C is a diagram illustrating an example of a fixed-point number.

FIG. 3A is a diagram illustrating an example of a floating-point number. FIG. 3B is a diagram illustrating an example of an integer. FIG. 3C is a diagram illustrating an example of a fixed-point number.

Referring to FIG. 3A, a floating-point number NFP may be expressed in the form of a sign and $1.a \times 2^b$, wherein b is an exponent part and a is a fraction part. According to the IEEE754 standard of IEEE (Institute of Electrical and Electronics Engineers) regarding a floating-point operation, one bit in a 32-bit floating-point number NFP represents a sign, 8 bits represent an exponent part, and 23 bits represent a fraction part. As shown in FIG. 3A, a MSB (the most significant bit) may represent a sign, 8 bits after the MSB may represent an exponent part, and the remaining 23 bits may represent a fraction part (or a fraction or a valid number). However, the floating-point number NFP of FIG. 3A is merely an example, and the numbers of bits representing the exponent part and the fraction part may vary according to the number of bits of a floating-point number.

Referring to FIG. 3B, an integer N(INT) may be expressed in various types according to the presence of a sign and a data size (number of bits). For example, an integer commonly used in a computing operation may be represented as 8-bit data as shown in FIG. 3B. The integer N(INT) may be represented as an unsigned 2's complementary number, wherein a value of the integer N(INT) including 8 bits may be represented by Equation 1 as follows:

$$\Sigma_{i=0}^{7} D_i * 2^i$$

[Equation 1]

In the case of an integer represented as an unsigned 2's complementary number according to Equation 1, i represents a position of a bit in the integer N(INT). For example, when an integer is represented as 8-bit data, i represents a LSB (the least significant bit) when i is 0 and represents a MSB when i is 7. Di represents a bit value of an i-th bit (i.e., 0 or 1).

When the integer N(INT) is represented by a signed 1's complementary number, the MSB represents a sign and subsequent bits represent an integer part INTn. For example, when the integer N (INT) is 8-bit data, an eighth bit, that is, the MSB, represents a sign, and the lower seven bits represent the integer part INTn. The value of the integer N(INT) represented as a signed 1's complementary number may be represented by Equation 2, as follows:

$$\Sigma_{i=0}^{6} D_i * 2^i - D_7 * 2^7$$

[Equation 2]

Referring to FIG. 3C, a fixed-point number N(FX) may include an integer part INTn and a fraction part Fn. Assuming that, for example, in the fixed-point number N(FX) represented by 32 bits, the decimal point is located between a K-th bit [K−1] and a K+1-th bit [K] (K is a positive integer), the upper (32−K) bits may represent the integer part INTn and the lower K bits may represent the fraction part Fn. When the fixed-point number N(FX) is represented by a signed 1's complementary number, a 32nd bit, i.e., the MSB, may represent a sign. The sign and the size of the fixed-point number N(FX) may be calculated similar to those of an integer. However, the decimal point is located below the zero position in an integer, whereas the decimal point is located between the Kth bit and the K+1th bit, that is, after the upper 32−K bits, in the fixed-point number N(FX). Therefore, a value of the fixed-point number N(FX) including 32 bits may be represented by Equation 3.

$$\Sigma_{i=0}^{30} D_i * 2^{i-K} + a * D_{31} * 2^{31-K}$$

[Equation 3]

When the fixed-point number N(FX) is unsigned, a is 1. When the fixed-point number N(FX) is signed, a is −1.

In Equation 3, when K is 0, Equation 3 is expressed the same as Equation 1 or Equation 2 indicating a value of an integer. When K is not 0, (i.e., positive integer) indicating a fixed-point number, the integer N(INT) and the fixed-point number N(FX) may be processed by an integer operator.

However, in the floating-point number N(FP) shown in FIG. 3A, some bits indicate an exponent part. Therefore, the floating-point number N(FP) has a structure different from those of the integer N(INT) of FIG. 3B and the fixed-point number N(FX) of FIG. 3C and is unable to be processed by an integer operator. Therefore, a data converter (e.g., data converter 20 of FIG. 1) converts the floating-point number N(FP) to the integer N(INT) (or to the fixed-point number N(FX)) and the integer operator processes the integer N(INT). As a result, the neural network device 120 may process the floating-point number N(FP) based on an integer operation.

Between a floating-point number and an integer including the same number of bits, the integer may represent a more accurate value. For example, in the case of a 16-bit floating-point number, according to the IEEE 754 standard, a fraction part corresponding to a valid value is represented by 10 bits, whereas 16 bits may represent valid data in an integer. Therefore, an operation result of a neural network (e.g., a convolution operation result) obtained as the data converter 20 converts floating-point data to integer-type data and performs an operation based on the integer-type data may have higher accuracy than a floating-point operation. For practical purposes, the use of the data converter 20 may result in higher accuracy for operation results of the neural network. Nevertheless, the use of the data converter 20 may itself be improved, such as when a variable indicating the position of the decimal point can be provided.

Figure 4:
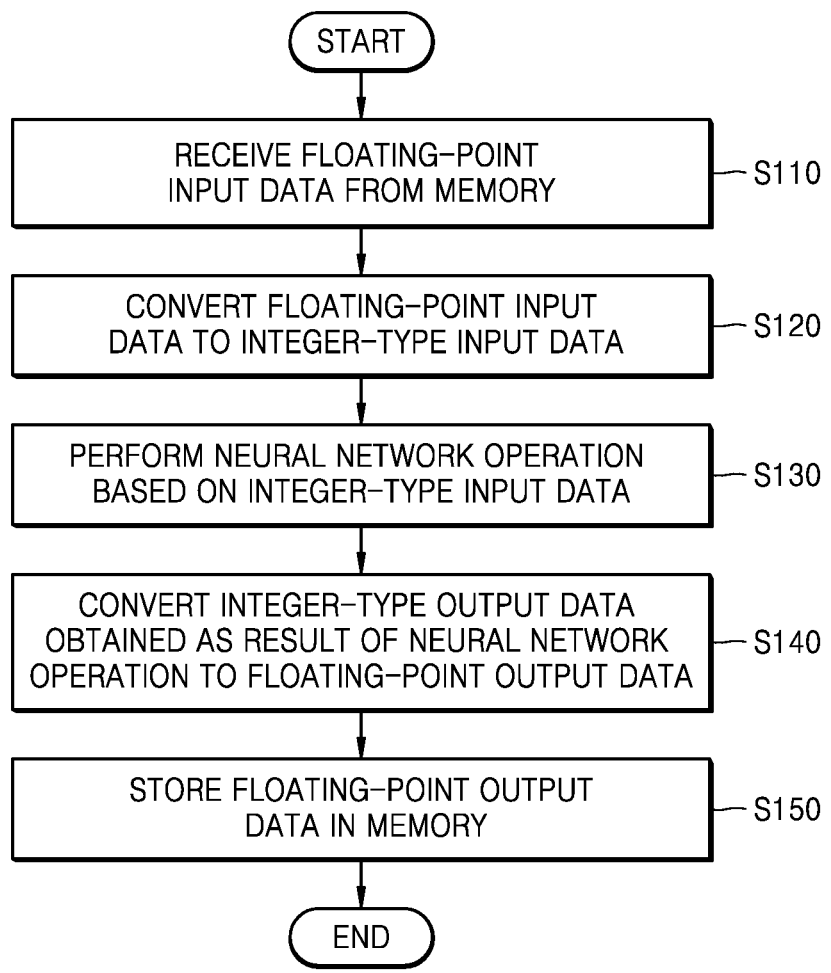
FIG. 4 is a diagram showing a method of operating a neural network device, according to an example embodiment.

FIG. 4 is a diagram showing a method of operating a neural network device, according to an example embodiment. The method of FIG. 4 may be performed in a neural network device (120 of FIG. 1) for a neural network operation. Therefore, descriptions below will be given with reference to FIG. 1 together.

Referring to FIG. 4, the neural network device 120 may receive floating-point input data from the memory 130 (operation S110). The floating-point input data may include input feature values, weight values, and function coefficients needed for a neural network operation. Therefore, the floating-point input data may be characterized partly or fully as input values. Also, when the neural network device 120 processes a quantized neural network, the floating-point input data may include quantization parameters. For example, the quantization parameters may include a scale value (or an inverse scale value), a bias value, etc. The neural network device 120, and particularly the data converter 20, may perform quantization and data conversion of input values from the floating-point input data. As an example, the neural network device 120 may perform quantization and data conversion of input values based on two quantization parameters.

The neural network device 120 may convert the floating-point input data to integer-type input data (operation S120). For example, the data converter 20 may convert a floating-point number of input data received from a memory 130 to integer-type data, e.g., an integer or a fixed-point number. In an embodiment, the data converter 20 may convert floating-point data to quantized integer-type data based on quantization parameters. For example, the neural network device 120 may perform quantization and conversion of an input value received as the floating-point input data. The quantization and conversion may be performed based on two quantization parameters.

The neural network device 120 may perform a neural network operation based on the integer-type input data (operation S130). The neural network device 120 includes an integer operator and may perform a neural network operation by performing an integer operation on integer-type input data. For example, a neural network operation may include convolution, a multiply and accumulate (MAC) operation, pooling, etc. As a neural network operation is performed, integer-type output data may be generated.

The neural network device 120 may convert the integer-type output data to floating-point output data (operation S140). For example, the data converter 20 may convert an integer or a fixed-point number of integer-type output data to a floating-point number. That is, the data converter 20 converts or may convert integer-type output data to floating-point output data. In an embodiment, the data converter 20 may convert floating-point output data to dequantized floating-point output data based on quantization parameters. For example, the data converter 20 may perform inverse quantization and data conversion of an output value of the floating-point output data, in the converting of the integer-type output data to floating-point output data. The inverse quantization and data conversion may be performed based on two quantization parameters received as the floating-point input data. The neural network device 120 may store the floating-point output data in the memory 130 (operation S150).

Figure 5A:
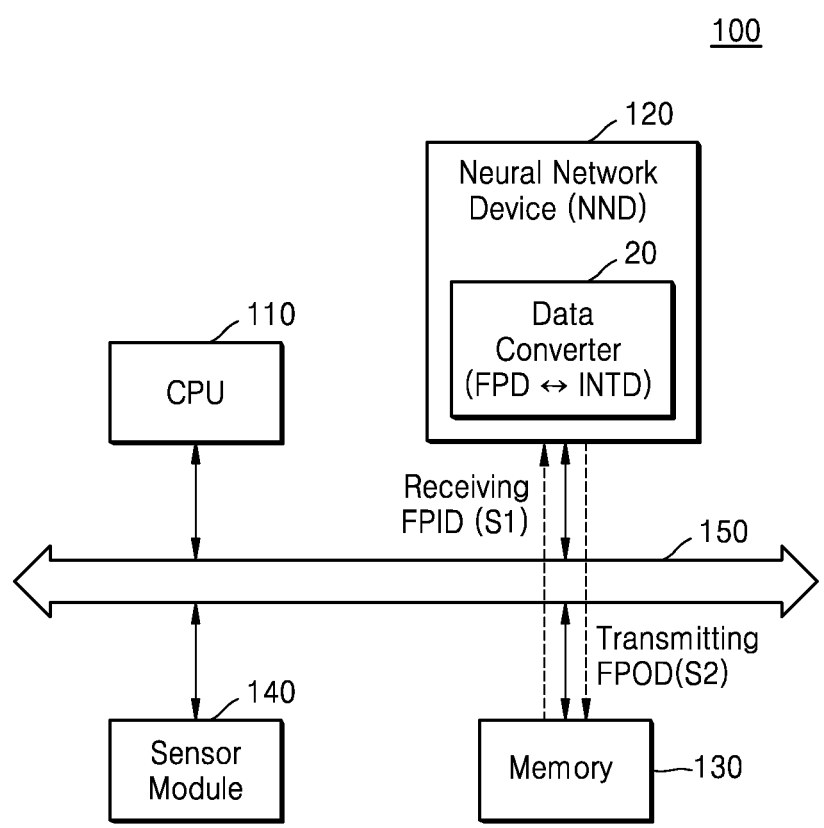
FIG. 5A is a diagram showing operations of a neural network system according to an example embodiment.
Figure 5B:
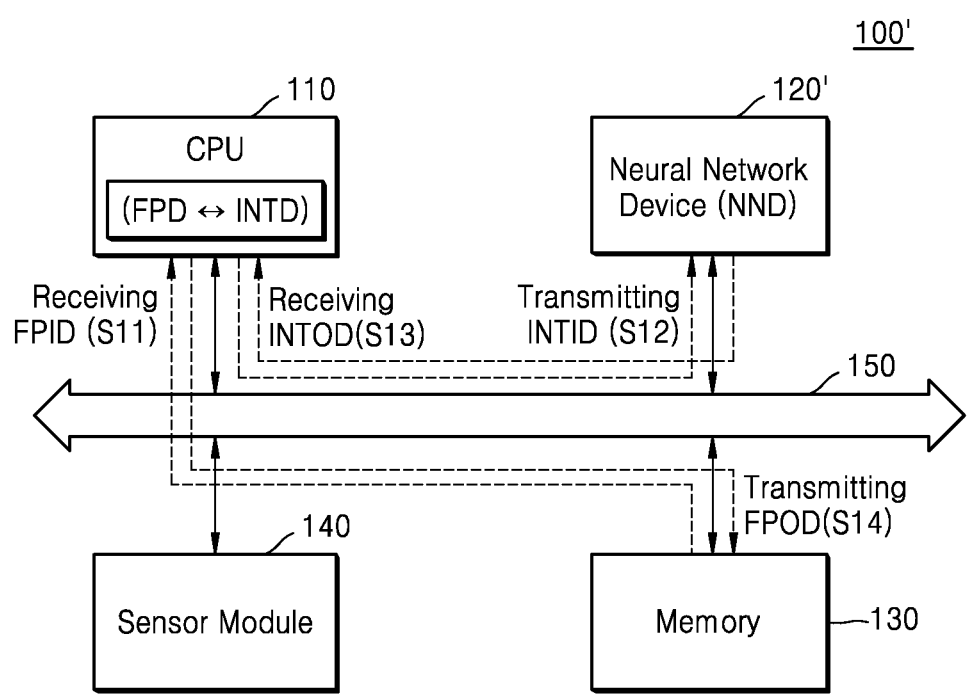
FIG. 5B is a diagram showing operations of a neural network system according to a comparative example.

FIG. 5A is a diagram showing operations of a neural network system 100 according to an example embodiment, and FIG. 5B is a diagram showing operations of a neural network system 100' according to a comparative example.

Referring to FIG. 5A, the neural network device 120 may receive floating-point input data FPID from the memory 130 (operation S1). In an embodiment, the floating-point input data FPID may be transmitted from the memory 130 to the neural network device 120 via the bus 150 without the intervention of the CPU 110, or at least independent of processing of or for the floating-point input data FPID by the CPU 110. For example, the neural network device 120 may include a direct memory access (DMA) controller, and the DMA controller may access the memory 130 and read the floating-point input data FPID. Accordingly, the DMA controller may be configured to receive the floating-point input data FPID from the memory 130. The neural network device 120 may receive the floating-point input data FPID from the memory 130 by using the data converter 20 and convert the floating-point input data FPID to integer-type input data.

The neural network device 120 may convert the integer-type output data generated as a result of a neural network operation to floating-point output data FPOD by using the data converter 20 and output the floating-point output data FPOD to the memory 130 (operation S2). As noted previously, the neural network device 120 may be or include an integer operator and perform an integer operation based on integer-type input values converted from floating-point input values by the data converter 20 in S1. For example, a processor included in the neural network device 120 may perform a neural network operation on the integer-type data INTD converted from the floating-point input data FPID and output integer-type output data as a result of the neural network operation. The data converter 20 converts or may convert the integer-type output data output from the processor to the floating-point output data FPOD. In an embodiment, the floating-point output data FPOD may be transmitted to the memory 130 from the neural network device 120 via the bus 150 without the intervention of the CPU 110, or at least independent of processing of or for the floating-point output data FPOD by the CPU 110.

As described above, in the neural network system 100 according to an example embodiment, the neural network device 120 includes the data converter 20. Data conversion may be performed when the floating-point input data FPID and the floating-point output data FPOD are transmitted and received to and from the memory 130. Intermediate S1 and S2 described above, the data converter 20 may be configured to convert the floating-point input data FPID received through the DMA controller to integer-type input data that is subject to a neural network operation. The neural network operation may be performed by a processor included in the neural network device 120 that is configured to perform a neural network operation based on an integer operation by using the integer-type input data provided from the data converter 20.

In the neural network system 100' according to the comparative example of FIG. 5B, a neural network device 120' does not include a data converter. Therefore, since the neural network device 120' includes an integer operator, another component, e.g., the CPU 110, may perform an operation for converting floating-point data to integer-type data to process the floating-point data. The CPU 110 may receive the floating-point input data FPID output from the memory 130 via the bus 150 (operation S11), convert the floating-point input data FPID to integer-type input data INTID, and transmit the integer-type input data INTID to the neural network device 120' via the bus 150 (operation S12). Also, the CPU 110 may receive integer-type output data INTOD output from the neural network device 120' via the bus 150 (operation S13), convert the integer-type output data INTOD to floating-point output data FPOD, and transmit the floating-point output data FPOD to the memory 130 via the bus 150 (operation S14).

As described above with reference to FIG. 5A, in the neural network system 100 according to an example embodiment, the neural network device 120 performs data conversion while transmitting and receiving floating-point data, e.g., the floating-point input data FPID and the floating-point output data FPOD, and the floating-point data may be directly transmitted from the memory 130 to the neural network device 120. Therefore, according to the neural network system 100 according to an example embodiment, the frequency of using the bus 150 is reduced, and thus deterioration of a processing speed due to a bandwidth BW of the bus 150 may be reduced. Also, since the neural network device 120 performs data conversion, the operation load of the CPU 110 is reduced, and thus the processing speed of the neural network device 120 may be improved.

Figure 6:
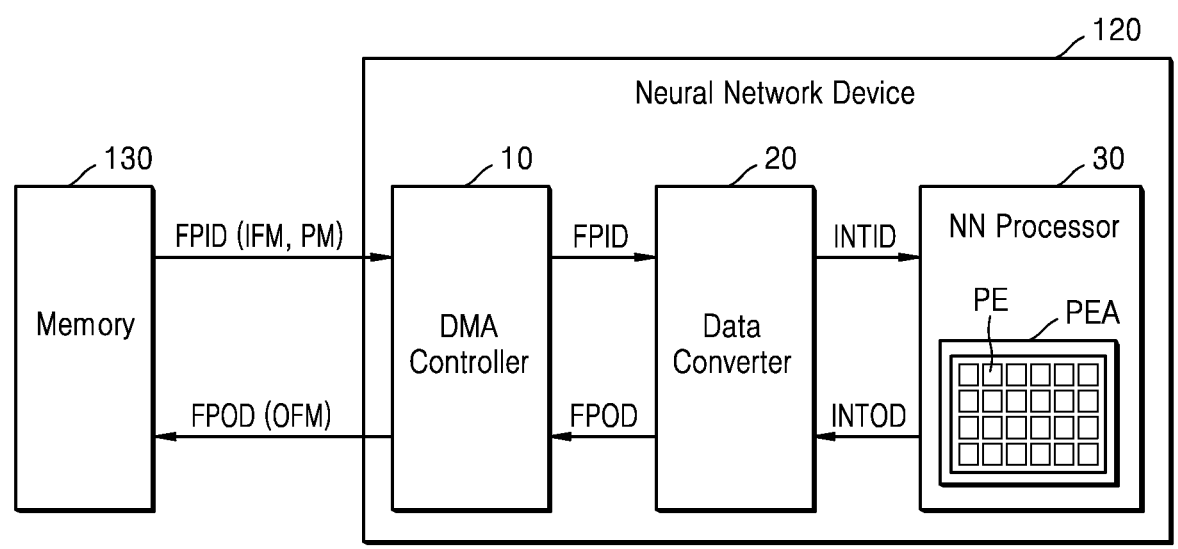
FIG. 6 is a diagram showing a neural network device according to an example embodiment.

FIG. 6 is a diagram showing a neural network device according to an example embodiment. The memory 130 is also illustrated for convenience of explanation.

Referring to FIG. 6, the neural network device 120 may include a DMA controller 10, the data converter 20, and a neural network processor 30. In FIG. 6, the DMA controller 10 and the data converter 20 are shown as separate components. However, according to embodiments, the data converter 20 may be implemented as a part of the DMA controller 10. According to embodiments, the neural network device 120 may include multiple data converters 20. The number of data converters 20 may be determined based on the processing speed of the neural network processor 30 and the bandwidth of the memory 130.

The DMA controller 10 may communicate directly with the memory 130. The DMA controller 10 may receive data (e.g., floating-point data) from the memory 130 and transmit data to the memory 130 without an intervention of another processor (e.g., a CPU such as the CPU 110, or a GPU, etc.), or at least independent of processing of or for the received data by the other processor. The DMA controller 10 may receive the floating-point input data FPID from the memory 130 and transmit the floating-point output data FPOD provided from the data converter 20 to the memory 130. For example, the floating-point input data FPID may include an input feature map IFM, operation parameters PM, etc. The floating-point input data FPID may also include quantization parameters, such as two or more quantization parameters used for quantization and/or dequantization.

The data converter 20 may perform data conversion between floating-point data and integer-type data. The data converter 20 may convert the fixed-point input data FPID received from the DMA controller 10 to the integer-type input data INTID and transmit the integer-type input data INTID to the neural network processor 30. Also, the data converter 20 may convert the integer-type output data INTOD output from the neural network processor 30 to the floating-point output data FPOD. That is, the data converter 20 converts integer-type output data output from the neural network processor 30 to floating-point output data. For example, floating-point output data FPOD may include an output feature map OFM.

According to embodiments, the data converter 20 may generate quantized integer-type input data INTID by performing quantization on the fixed-point input data FPID based on quantization parameters such as based on at least two quantization parameters. Also, the data converter 20 may generate dequantized floating-point output data FPOD by performing inverse quantization on the integer-type output data INTOD based on the quantization parameters such as based on at least two quantization parameters.

According to embodiments, the data converter 20 may simply convert the fixed-point input data FPID to the integer-type input data INTID. Also, the data converter 20 may simply convert the integer-type output data INTOD to the floating-point output data FPOD.

According to embodiments, the data converter 20 may perform MAC operations on integer-type data. For example, the data converter 20 performs a MAC operation on integer-type data received from the memory 130 or integer-type data output from the neural network processor 30, thereby reducing the operation load of the neural network processor 30. The operation of the data converter 20 according to the above-described embodiments may be performed by selectively operating some of the components of the data converter 20. In these embodiments, the data converter 20 may be or include an integer operator and perform an integer operation based on integer-type input values received by the data converter 20 or converted from floating-point input values by the data converter 20.

The neural network processor 30 may include a processing element array PEA including multiple processing elements PE. Although not shown, the neural network processor 30 may include an internal memory and a controller for storing neural network parameters, e.g., bias values, weight values, input features, and output features. The processing elements PE may include one or more integer operators, and the neural network processor 30 may perform a neural network operation based on integer operations. For example, the neural network processor 30 may perform a convolution operation based on integer-type weight values and integer-type input feature values provided from the data converter 20. Accordingly, the neural network processor 30 may be or include an integer operator and perform an integer operation based on integer-type input values converted from floating-point input values by the data converter 20.

Hereinafter, the configuration and operation of the data converter 20 will be described.

Figure 7A:
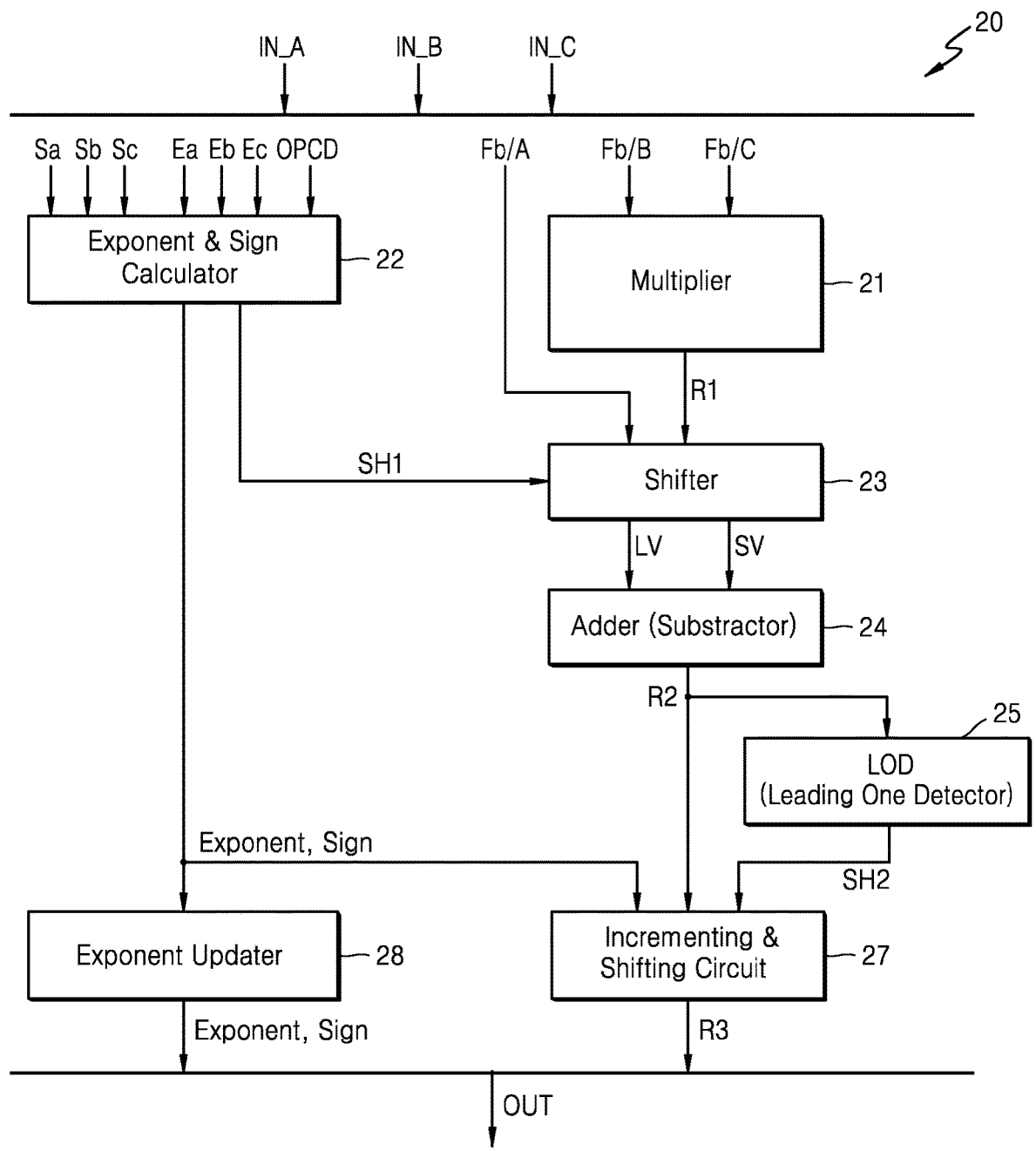
FIG. 7A is a circuit diagram showing a data converter according to an example embodiment.
Figure 7B:
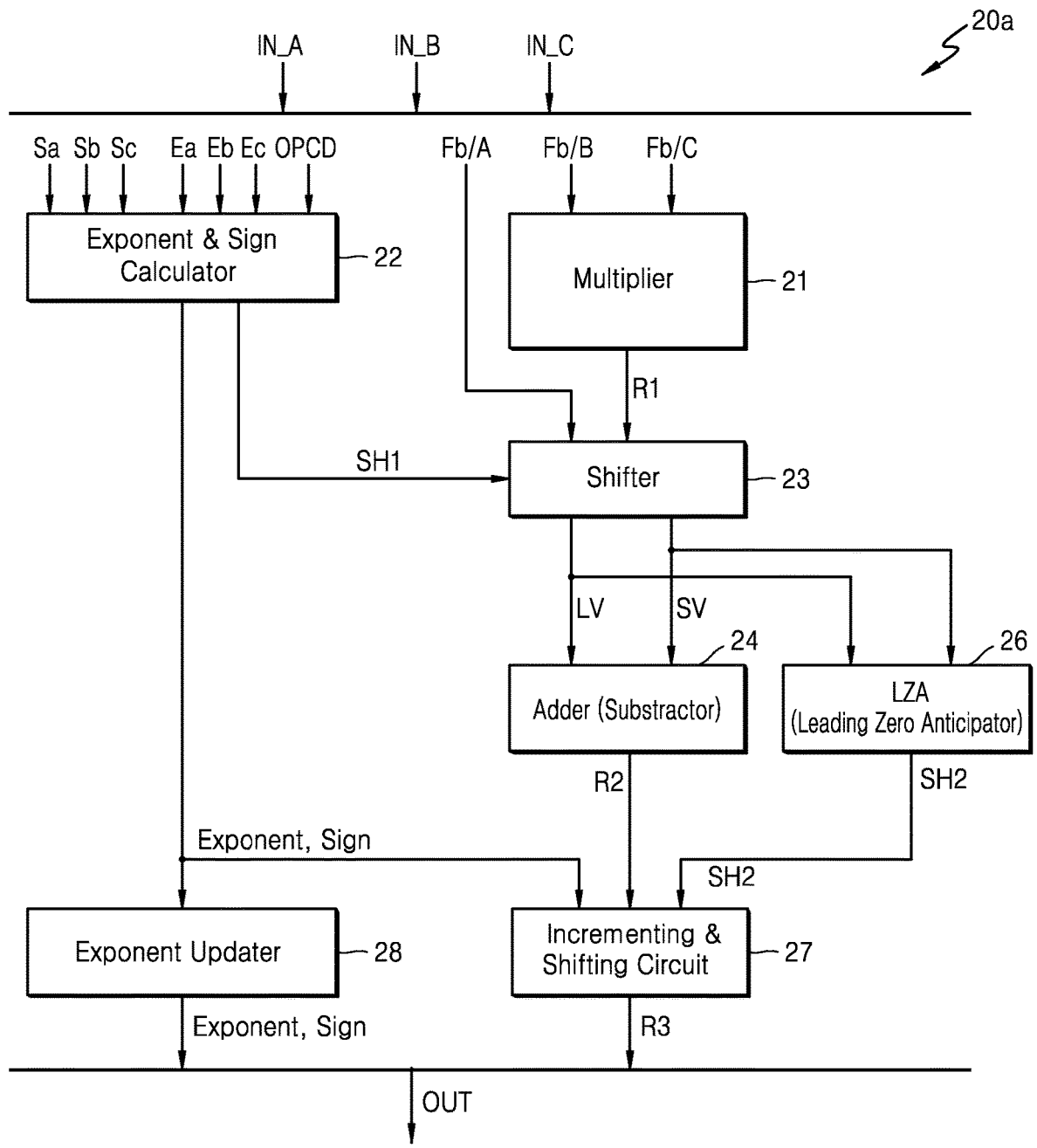
FIG. 7B is another circuit diagram showing the data converter of FIG. 7A according to an example embodiment.

FIGS. 7A and 7B are circuit diagrams showing a data converter according to an example embodiment.

Referring to FIG. 7A, the data converter 20 may include a multiplier 21, an exponent and sign calculator 22, a shifter 23, an adder 24, a LOD 25 (leading one detector), an incrementing and shifting circuit 27, and an exponent updater 28. That is, the data converter 20 may include multiple floating-point operators such as the multiplier 21, the exponent and sign calculator 22, the adder 24, the LOD 25, and the exponent updater 28. The data converter 20 may also include multiple shifters such as the shifter 23 as a first shifter and the incrementing and shifting circuit 27 as a second shifter. At least some of the floating-point operators and the shifters may be deactivated and the remaining ones activated in one or more embodiments here. Activation and deactivation may be in accordance with a received operation code in embodiments described below.

The data converter 20 may perform data conversion by processing a first input IN_A, a second input IN_B, and a third input IN_C. The first input IN_A, the second input IN_B, and the third input IN_C may be floating-point numbers or integers.

Descriptions below will be given assuming that the first input IN_A, the second input IN_B, and the third input IN_C are floating-point numbers. As a reminder from the discussion above, a floating-point number NFP may be expressed in the form of a sign, an exponent part and a fraction part. Signs Sa, Sb, and Sc and exponent parts Ea, Eb, and Ec of the first input IN_A, the second input IN_B, and the third input IN_C are applied to the exponent and sign calculator 22, and the exponent and sign calculator 22 may determine exponents and signs output based on the signs Sa, Sb, and Sc and the exponents Ea, Eb, and Ec. The determined exponents and signs are of the various inputs including the first input IN_A, the second input IN_B and the third input IN_C. The exponent and sign calculator 22 may also determine shifting information SH1 provided to the shifter 23. The shifting information SH1 may include a shifting direction, a shifting amount, and a shift number (e.g., which of two inputs is shifted). The detailed operation of the exponent and sign calculator 22 will be described below with reference to FIGS. 8A, 11, and 12.

The multiplier 21 may multiply two inputs applied thereto, e.g., fraction parts Fb and Fc of the second input IN_B and the third input IN_C, and output a result thereof. According to embodiments, the multiplier 21 may support MAC operations for integer-type data and may be implemented as a multiplier (e.g., a 32-bit multiplier) with an extended number of bits instead of a 24-bit multiplier according to a single precision.

The shifter 23 may receive an output R1 of the multiplier 21 and the first input IN_A and shift the output R1 or the first input IN_A having a smaller exponent value based on the shifting information SH1 provided from the exponent and sign calculator 22. The shifter 23 may be configured to output a first output of the first value LV and a second output of the second value SV.

The adder 24 may sum a first value LV and a second value SV received from the shifter 23. The first value LV may be a first output that is output from the shifter 23, and the second value SV may be a second output that is output from the shifter 23. The adder 24 may be configured to generate a third output by summing the first value LV as the first output and the second value SV as the second output. At this time, the absolute values of the first value LV and the second value SV are received by the adder 24, and the adder 24 may also function as a subtractor depending on signs of the first value LV and the second value SV.

The LOD 25 may receive an output R2 of the adder 24 and detect the position of a preceding '1' in the output R2 of the adder 24. The LOD 25 may generate shifting information SH2, such that the preceding '1' becomes the MSB of a fraction part of an output value OUT for post-normalizing the output R2 of the adder 24.

The incrementing and shifting circuit 27 may determine whether to round off the output R2 of the adder 24 by reflecting a rounding policy according to an operation code OPCD. The incrementing and shifting circuit 27 may determine a shifting amount based on the shifting information SH2 received from the LOD 25, information indicating whether to round off, and an exponent and a sign (or shifting information) provided from the exponent and sign calculator 22 and shift the output R2 of the adder 24 according to the shifting amount. In other words, the incrementing and shifting circuit 27 may be configured to shift an output of the adder 24 based on a first shifting value provided based on a position of a preceding '1' included in the output of the adder 24 and a second shifting value provided based on exponents and signs of the inputs. Since there are at least three inputs detailed above, the three inputs include at least two inputs and one or more remaining inputs.

The exponent updater 28 may output an exponent and a sign provided from the exponent and sign calculator 22 as the exponent and the sign of the output value OUT or update the exponent and the sign and output the updated exponent and sign as the exponent and the sign of the output value OUT.

According to embodiments, the data converter 20 may have a structure similar to that of a fused multiply-add (FMA) circuit used for a floating-point operation, and the components of the data converter 20 may vary. Relative to the embodiment of FIG. 5A described above, the data converter 20 may perform one or more functions between S1 and S2. For example, the data converter 20 may be configured to convert the floating-point data received through a DMA controller to integer-type data. As described with respect to FIG. 6 above, a DMA controller 10 may be implemented as an integrated component of the data converter 20 or as a separate component from the data converter 20. The data converter 20 may perform or be configured to perform a floating-point fused multiply-add (FMA) operation and may include a floating-point FMA circuit. A floating-point FMA circuit may include the adder.

The data converter 20 according to an example embodiment may operate in one of various operation modes described below with reference to FIGS. 8A to 13 according to the operation code OPCD. At this time, the components (the multiplier 21, the exponent and sign calculator 22, the shifter 23, the adder 24, the LOD 25, the incrementing and shifting circuit 27, and the exponent updater 28) may selectively operate. In other words, depending on the operation mode, some of the components of the data converter 20 may be activated and some others may be inactivated, and input/output relationships between the components may be changed.

Also, although the above-stated descriptions are given assuming that the first input IN_A, the second input IN_B, and the third input IN_C are floating-point numbers, in some operation modes, the first input IN_A, the second input IN_B, and the third input IN_C may be integers, and the data converter 20 and even the overall neural network device 120 may operate based on data A, B, and C of the first input (IN_A), the second input (IN_B) and the third input (IN_C) data (A, B, C).

FIG. 7B is a circuit diagram showing a data converter according to an example embodiment. Referring to FIG. 7B, a data converter 20a may include the multiplier 21, the exponent and sign calculator 22, the shifter 23, the adder 24, a LZA 26 (leading zero anticipator), the incrementing and shifting circuit 27, and a exponent updater 28.

The configuration and function of the data converter 20a is similar to those of the data converter 20 of FIG. 7A. However, the LZA 26 may be used instead of the LOD 25 shown in FIG. 7A. The first value LV may be a first shifting value provided based on a position of a preceding 1 included in the output of the adder 24. The LZA 26 may receive the first value LV and the second value SV output from the shifter 23 and output a bit shifting amount, for example, shifting information SH2 needed to round off and post-normalize the output R2 of the adder 24 based on the first value LV and the second value SV. The LOD 25 of FIG. 7A may be replaced by the LZA 26 of FIG. 7B. For example, when a fast processing speed is needed, as shown in FIG. 7B, the data converter 20a may include the LZA 26. On the other hand, when low power consumption is needed, the data converter 20 may include the LOD 25. However, the data converter 20a is not limited thereto. In some embodiments, the data converter 20a may further include the LOD 25 along with the LZA 26, and one of the LOD 25 and the LZA 26 may selectively operate according to a performance needed by the data converter 20a. For example, when a fast processing speed of the data converter 20a is needed, the LZA 26 may be used. When low power consumption is needed, the LOD 25 may be used.

Hereinafter, an operation method according to the operation modes of the data converter (20 of FIG. 7A) according to an example will be described. The description below is also applicable to the data converter 20a of FIG. 7B.

Figure 8A:
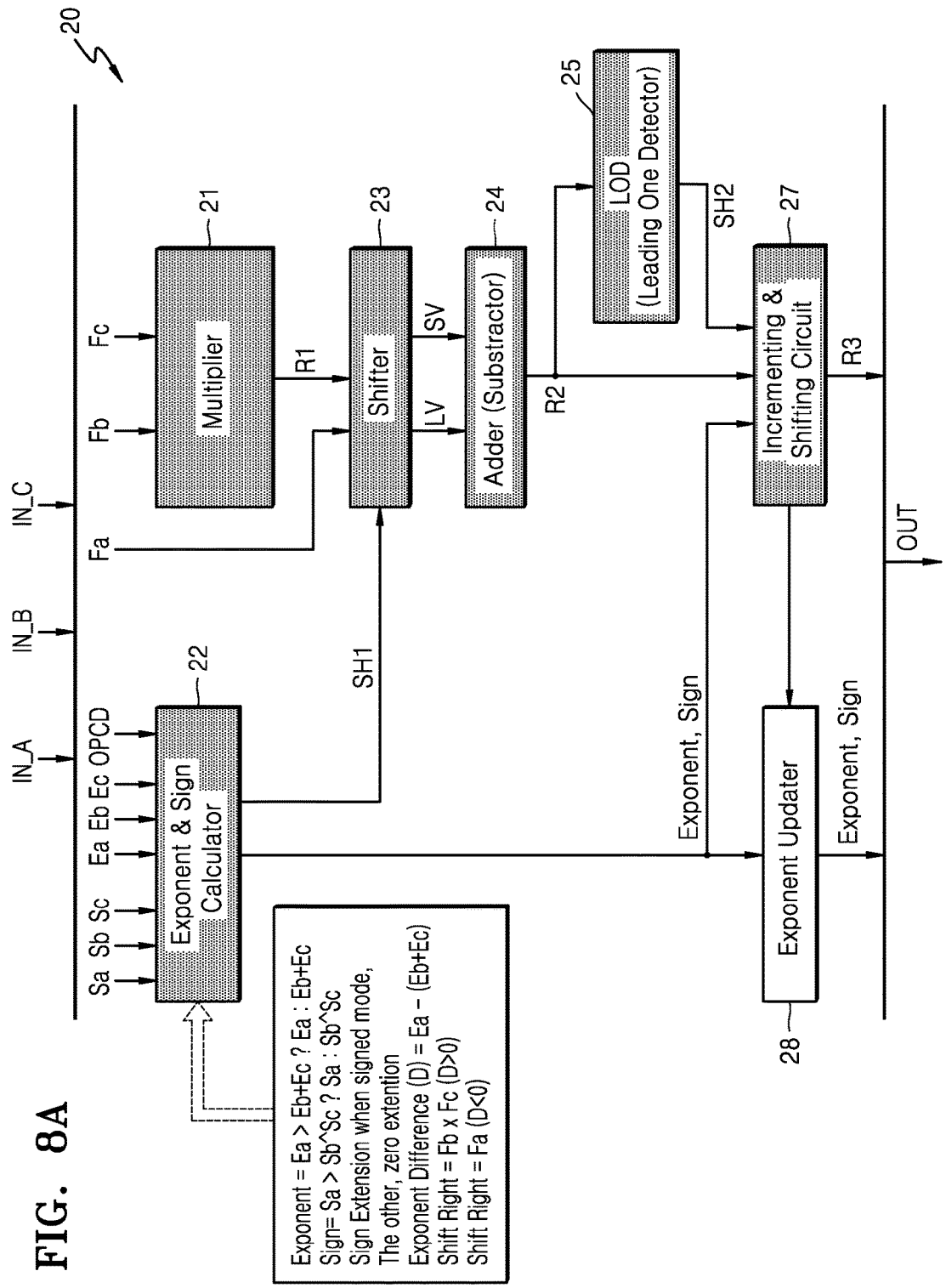
FIG. 8A is a diagram showing an example of an operation mode of a data converter according to an example embodiment.

FIG. 8A is a diagram showing an example of an operation mode of a data converter according to an example embodiment, and FIG. 8B is a diagram showing the inputs of the data converter of FIG. 8A. In detail, FIG. 8A shows a method (quantized FP to INT conversion) in which the data converter 20 quantizes floating-point data by performing floating-point FMA operations on the first input IN_A, the second input IN_B, and the third input IN_C and converting quantized values to integer-type data. As shown in FIG. 8B, the first input IN_A, the second input IN_B, and the third input IN_C may include the signs Sa, Sb, and Sc, the exponent parts Ea, Eb, and Ec, and the fraction parts Fa, Fb, and Fc, respectively.

As a reminder, the data converter 20 may include multiple floating-point operators and shifters that are selectively deactivated and activated. Deactivation and activation may be performed according to a received operation code, for example, so that the activated floating-point operators and/or shifters perform an operation mode according to the operation code. At least some of the floating-point operators and the shifters may be deactivated and the remaining ones activated according to a received operation code.

A real number R may be expressed as shown in Equation 4, and a quantization equation for the real number R may be expressed as shown in Equation 5.

$$R = S \times (Q - Z) = S \times Q - S \times Z \quad \text{[Equation 4]}$$

$$Q = \frac{R}{S} + Z = R \times \frac{1}{S} + Z \quad \text{[Equation 5]}$$

Here, Q denotes a quantized integer for the real number R, S denotes a scale factor, and Z denotes a zero-point offset. The real number R, the scale factor S, and the zero-point offset Z are floating-point numbers.

Referring to FIG. 8A, the first input IN_A, the second input IN_B, and the third input IN_C may indicate the zero point offset Z, the real number R to be converted, and the inverse number 1/S of the scale factor. The operation code OPCD may indicate the data type of the output value OUT from the data converter 20 (e.g., whether the output value OUT is a signed integer or an unsigned integer and the number of bits of an integer). The zero-point offset Z and inverse number 1/S of the scale factor are examples of two quantization parameters, and a neural network using a quantization model may provide quantization parameters. The first input IN_A, the second input IN_B, and the third input IN_C are floating-point input data and may be received from the memory (130 of FIG. 1).

The data converter 20 may output a quantized integer for the second input IN_B as the output value OUT by performing an operation according to Equation 6.

$$OUT = INT(IN\_A + IN\_B \times IN\_C) \quad \text{[Equation 6]}$$

Here, INT denotes a conversion of a floating-point number to an integer and indicates an integer conversion after floating-point FMA operations of the first input IN_A, the second input IN_B, and the third input IN_C.

When the operation code OPCD indicates an operation mode indicating quantization and data conversion, the multiplier 21, the exponent and sign calculator 22, the shifter 23, the adder 24, the LOD 25, and the incrementing and shifting circuit 27 may be activated and the exponent updater 28 may be deactivated. The multiplier 21, the exponent and sign calculator 22, the shifter 23, the adder 24, the LOD 25, and the incrementing and shifting circuit 27 may perform quantization and data conversion by operating as described above with reference to FIG. 7A.

Here, the exponent and sign calculator 22 may select a larger value between a sum of the exponent part Eb of the second input IN_B and the exponent part Ec of the third input IN_C or the exponent part Ea of the first input IN_A, as the exponent part of the output value OUT. The exponent and sign calculator 22 may perform an exclusive OR operation on the sign Sb of the second input IN_B and the sign Sc of the third input IN_C and select a larger value between a result thereof and the sign Sa of the first input IN_A as the sign of the output value OUT. Also, the exponent and sign calculator 22 may perform sign extension when a data type according to the operation code OPCD is signed. The exponent and sign calculator 22 may provide a flag indicating shifting reflecting the sign extension to the shifter 23 as the shifting information SH1.

A value obtained by subtracting a sum of the exponent part Eb of the second input IN_B and the exponent part Ec of the third input IN_C from the exponent part Ea of the first input IN_A, that is, an exponential difference D, may be greater than 0. When this happens, the exponent and sign calculator 22 may generate the shifting information SH1 instructing to shift the output R1 of the multiplier 21 to the right as mush as the absolute value of the exponential difference D. The output R1 is a value obtained by multiplying the fraction part Fb of the second input IN_B by the fraction part Fc of the third input IN_C. When the exponential difference D is less than 0, the exponent and sign calculator 22 the shifting information SH1 instructing to shift the fraction part Fa of the first input IN_A to the right as much as the absolute value of the exponential difference D. The shifter 23 may perform a shifting operation based on the shifting information SH1.

In this embodiment, since the output value OUT of the exponent and data converter 20 is an integer, the exponent updater 28 does not operate. Depending on the data type represented by the operation code OPCD, the output value OUT, which is an integer, may be signed or unsigned, and the number of data bits may be determined.

Figure 9A:
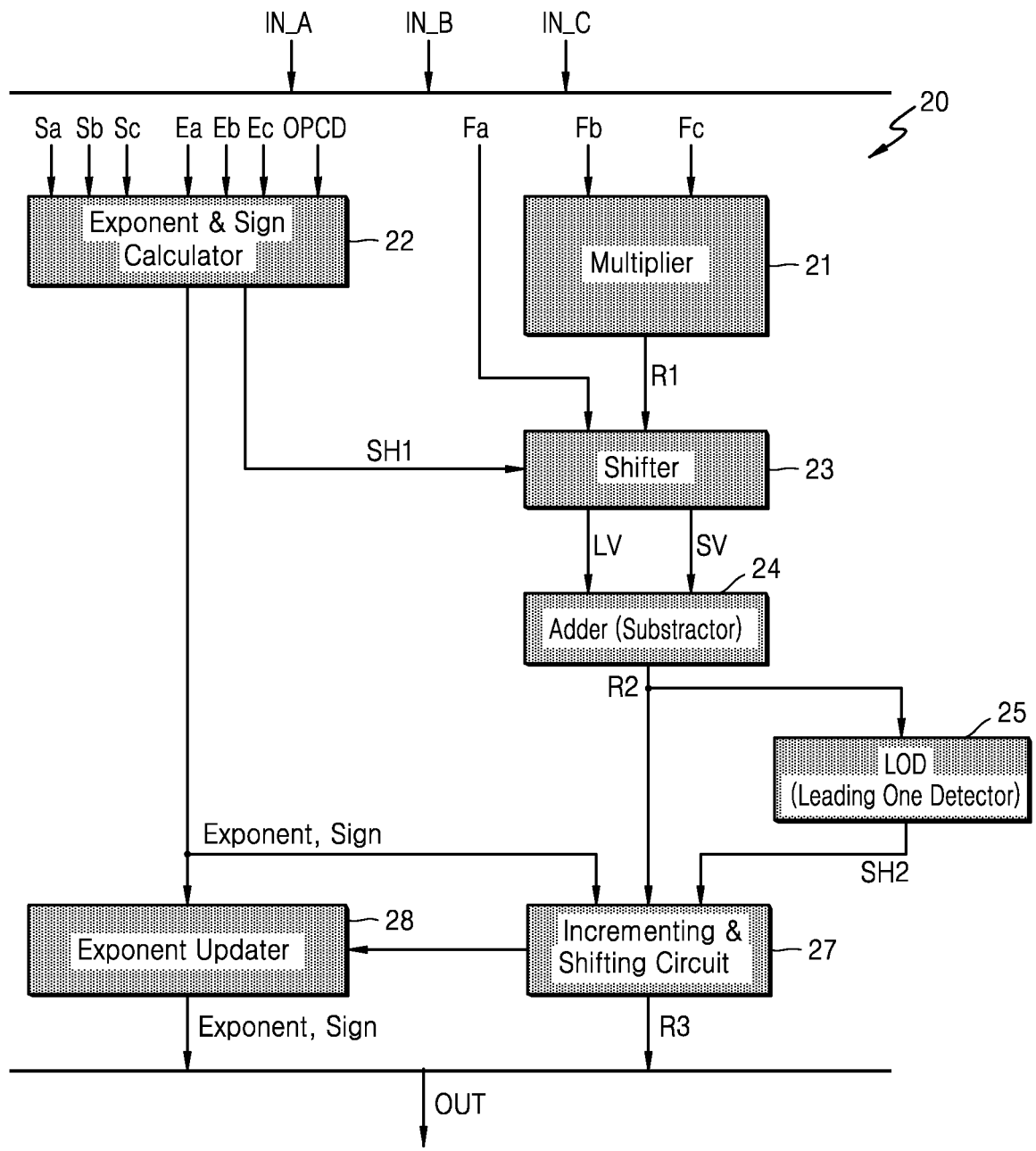
FIG. 9A is a diagram showing an example of an operation mode of a data converter according to an example embodiment.

FIG. 9A is a diagram showing an example of an operation mode of a data converter according to an example embodiment, and FIG. 9B is a diagram showing inputs of the data converter of FIG. 9A. In detail, FIG. 9A shows a method of converting a result of a neural network operation including an output of the neural network processor 30, that is, integer-type data, to floating-point data in a neural network using a quantization model (dequantized INT to FP conversion).

The first input IN_A may be a value obtained by multiplying the scale factor S by the zero-point offset Z, the second input IN_B may be a quantized integer that is an output of the neural network processor 30, and the third input IN_C may be the scale factor S.

As shown in FIG. 9A, the first input IN_A and the third input IN_C may be floating-point numbers, and the second input IN_B may be an integer. The exponent and sign calculator 22 may set the sign Sb and exponent part Eb of the second input IN_B, such that the second input IN_B may be computed like a floating-point number. In other words, the second input IN_B, which is an integer, may be preprocessed into a floating-point number. For example, when the second input IN_B is a signed 8-bit integer (i.e., 'signed char'), the MSB of the second input IN_B may be set as the sign Sb of the second input IN_B, and 7 may be set as the exponent part Eb of the second input IN_B. Also, the 8-bit data of the second input IN_B may be provided to the multiplier 21 as the fraction part Fb of the second input IN_B. When the second input IN_B is an unsigned 16-bit integer (i.e., 'unsigned char'), the sign Sb of the second input IN_B may be set to 0, the exponent part Eb may be set to 15, and the 16-bit data of the second input IN_B may be set as the fraction part Fb. The data converter 20 may output a dequantized floating-point number for the second input IN_B as the output value OUT by performing an operation according to Equation 7.

OUT=FLP(IN_$A$+IN_$B$×IN_$C$)

【Equation 7】

Here, FLP represents conversion of an integer to a floating-point number and indicates pre-processing of the second input IN_B, which is an integer, into a floating-point number and floating-point FMA operations on the first input IN_A, the second input IN_B, and the third input IN_C.

In this embodiment, all of the components of the data converter 20 may be activated and operated. Since the operations of the components of the data converter 20 are identical to those described above with reference to FIGS. 7A and 9A, descriptions already given above will be omitted.

Figure 10:
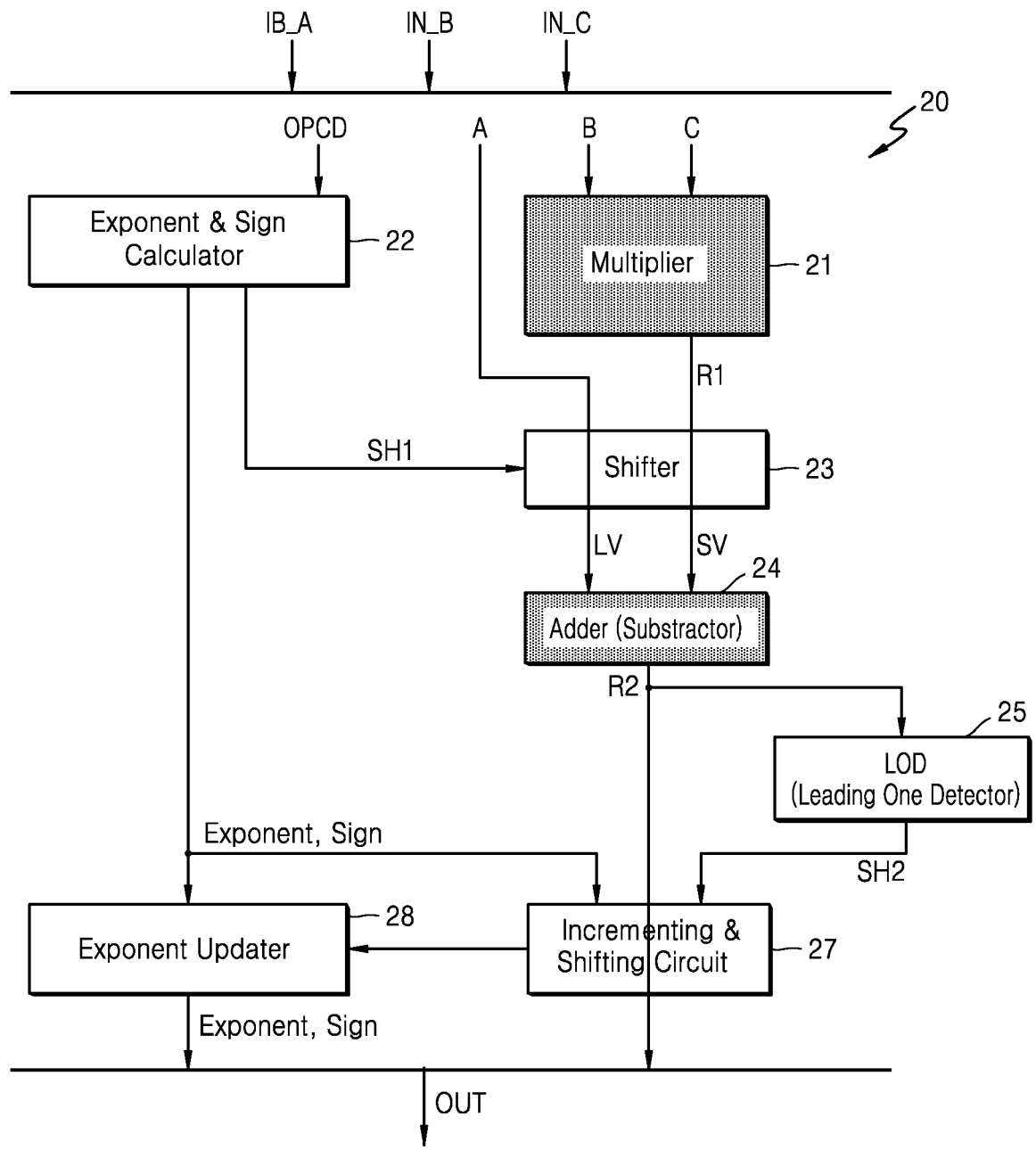
FIG. 10 is a diagram showing an example of an operational mode of a data converter according to an example embodiment.

FIG. 10 is a diagram showing an example of an operational mode of a data converter according to an example embodiment. In detail, the present embodiment indicates that the data converter 20 receives integer-type data as an input and performs a MAC operation on the integer-type data. When a neural network processor (30 of FIG. 6) performs a general operation, the data converter 20 may process input data, thereby reducing the load of the neural network processor (30 of FIG. 6). For example, when the input data is YUV type input data and the neural network processor 30 is capable of processing RGB type input data, the data converter 20 may convert the YUV type input data to RGB type input data when data is received from the memory 130 and provide the RGB type input data to the neural network processor 30.

Referring to FIG. 10, the first input IN_A, the second input IN_B, and the third input IN_C are integers. When the operation code OPCD indicates an operation mode instructing a MAC operation of an integer, the multiplier 21 and the adder 24 may be activated, and the other configurations, that is, the exponent and sign calculator 22, the shifter 23, the LOD 25, the incrementing and shifting circuit 27, and the exponent updater 28 may be deactivated. The data converter 20 may operate based on the data A, B, and C of the first input IN_A, the second input IN_B, and the third input IN_C. The multiplier 21 may multiply data A of the second input IN_B by data B of the third input IN_C and output a result thereof. The output R1 of the multiplier 21 and data A of the first input IN_A may bypass the shifter 23 and be provided to the adder 24 as the first value LV and the second value SV. The adder 24 may output a result of summing the first value LV and the second value SV. The output R2 of the adder 24 may bypass the LOD 25 and the incrementing and shifting circuit 27 and be output as the output value OUT of the data converter 20.

Figure 11:
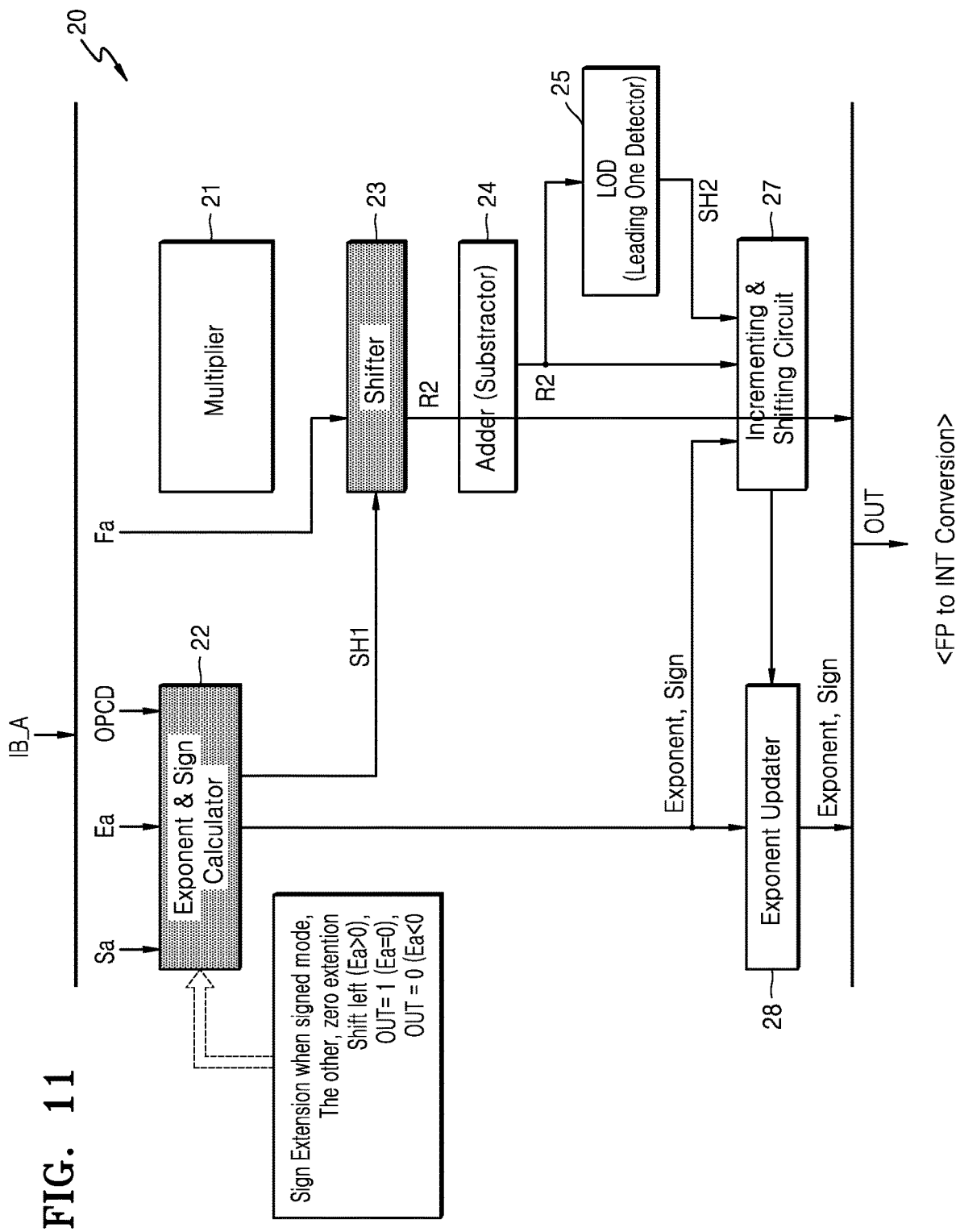
FIG. 11 is a diagram showing an example of an operational mode of a data converter according to an example embodiment.

FIG. 11 is a diagram showing an example of an operational mode of a data converter according to an example embodiment. In detail, the present embodiment indicates that the data converter 20 converts a floating-point number to an integer.

Referring to FIG. 11, the first input IN_A, which is a floating-point number, may be received and, when the operation code OPCD indicates an operation mode instructing a conversion of a floating-point number to an integer, the exponent and sign calculator 22 and the shifter 23 may be activated and the other configurations, that is, the multiplier 21, the adder 24, the LOD 25, the incrementing and shifting circuit 27, and the exponent updater 28 may be deactivated.

The exponent and sign calculator 22 may receive the sign Sa and the exponent part Ea of the first input IN_A. When a data type according to the operation code OPCD is signed, the exponent and sign calculator 22 may perform sign extension. The exponent and sign calculator 22 may provide a flag indicating shifting reflecting the sign extension to the shifter 23 as the shifting information SH1.

The exponent and sign calculator 22 may provide the shifting information SH1 instructing to shift the fraction part Fa to the left as much as the value of the exponent part Ea when the exponent part Ea is greater than 0 to the shifter 23 and, based on the shifting information SH1, the shifter 23 may shift the fraction part Fa of the first input IN_A to the left and output the result R2 thereof as the output value OUT of the data converter 20. Here, when the value of the exponent part Ea exceeds the number of bits according to the integer-type (e.g., 'char', 'short', and 'int') of the output value OUT, the output value OUT may be the maximum value of a corresponding integer-type. For example, when the output value OUT is expressed as a 32-bit integer, that is, as an 'int' type and the value of the exponent part Ea is greater than 32, the maximum value that may be expressed according to the 'int' type may be output as the output value OUT.

The exponent and sign calculator 22 may provide information indicating that the output value OUT is 1 when the exponent part Ea is 1 and may provide information indicating that the output value OUT is 0 when the exponent part Ea is 0, and the shifter 23 may output 0 or 1 as the output value OUT based on the information.

Therefore, the first input IN_A, which is a floating-point number, may be converted to an integer. Here, depending on the data type represented by the operation code OPCD, the output value OUT, which is an integer, may be signed or unsigned, and the number of data bits may be determined.

Figure 12:
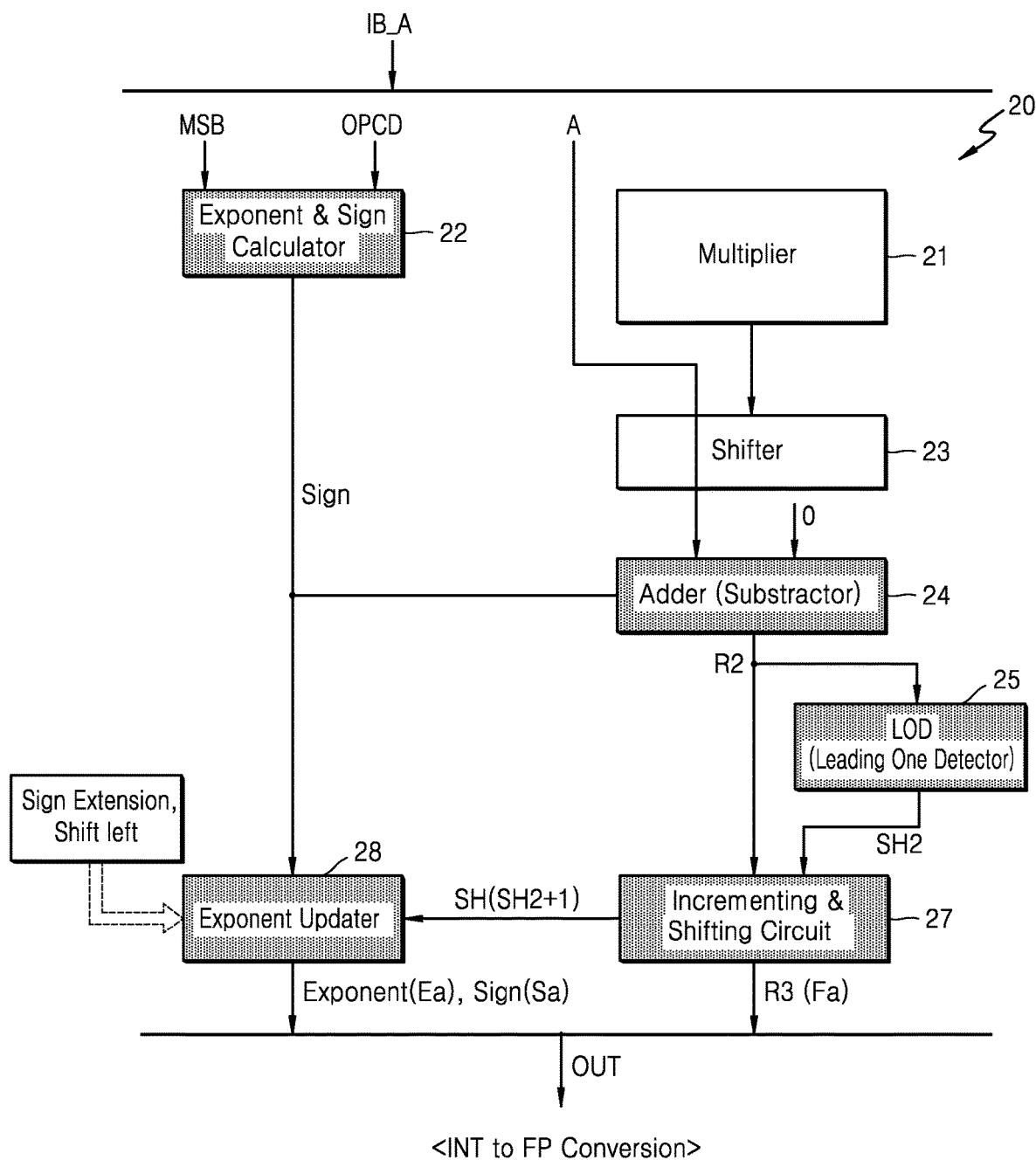
FIG. 12 is a diagram showing an example of an operational mode of a data converter according to an example embodiment.

FIG. 12 is a diagram showing an example of an operational mode of a data converter according to an example embodiment. In detail, the present embodiment indicates that the data converter 20 converts an integer to a floating-point number.

Referring to FIG. 12, the first input IN_A, which is an integer, may be received and, when the operation code OPCD indicates an operation mode instructing a conversion of an integer to a floating-point number (INT to FP conversion), the exponent and sign calculator 22, the adder 24, and the exponent updater 28 may be activated and the other configurations, that is, the multiplier 21, the shifter 23, the LOD 25, and the incrementing and shifting circuit 27 may be deactivated.

The exponent and sign calculator 22 may receive the MSB of the first input IN_A and determine the MSB as the sign of the output value OUT. Data A of the first input IN_A may bypass the shifter 23 and be provided as the first value LV of the adder 24. Data 0 may be provided as the second value SV, and the adder 24 may generate a value obtained by summing the first value LV and the second value LV based on the sign determined by the exponent and sign calculator 22 as the output R2. That is, the adder 24 may be configured to generate a third output by summing the first output and the second output. The LOD 25 may detect a preceding '1' in the output R2 of the adder 24 based on the output R2 of the adder 24 and generate the shifting information SH2 for matching the output R2 of the adder 24 to the fraction part of a floating-point number based on a result of the detection. For example, the shifting information SH2 may include a shifting value to represent the exponent part in a floating-point number.

The incrementing and shifting circuit 27 may output data bits representing valid data in the output R2 of the adder 24. Also, the incrementing and shifting circuit 27 may generates shifting information SH indicating a value obtained by adding 1 to the shifting information SH2, which is a shifting value calculated by the LOD 25, and provide the shifting information SH to the exponent and sign calculator 22.

In this embodiment, since the output value OUT of the data converter 20 is a floating-point number, the exponent updater 28 may perform sign extension, and the exponent part Ea of the output value OUT may be determined according to the number of bits of the first input IN_A. At this time, the exponent updater 28 may increment data of the exponent part Ea by shifting the exponent part Ea to the left based on the shifting information SH provided from the incrementing and shifting circuit 27, thereby updating the exponent part Ea. The sign Sa and the updated exponent part Ea output from the exponent updater 28 and an output R3 of the incrementing and shifting circuit 27, that is, the fraction part Fa may constitute the output value OUT, which is a floating-point number. Therefore, the first input IN_A, which is an integer, may be converted to a floating-point number.

Figure 13:
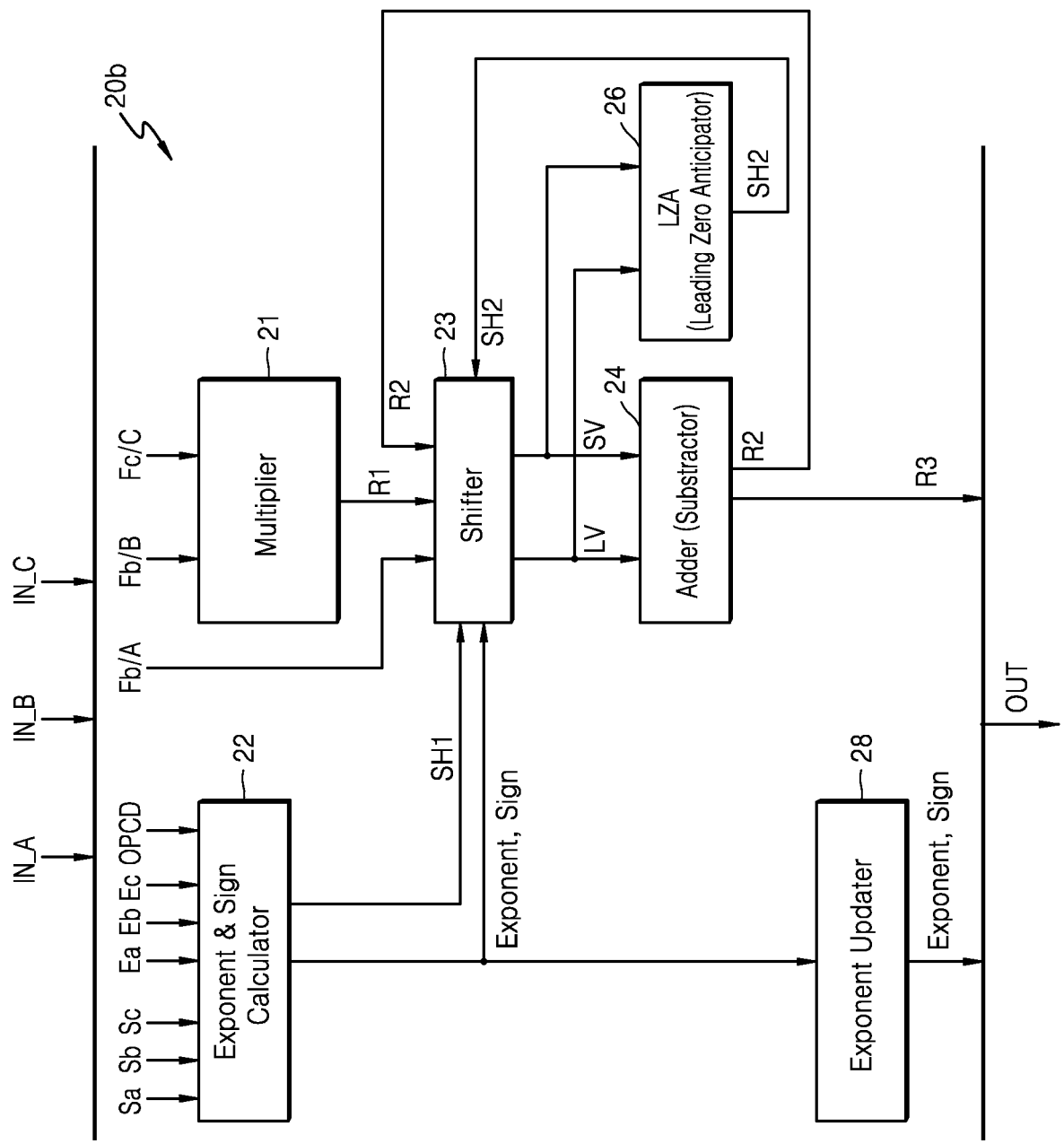
FIG. 13 is a circuit diagram showing a data converter according to an example embodiment.

FIG. 13 is a circuit diagram showing a data converter according to an example embodiment.

Referring to FIG. 13, the data converter 20b may include the multiplier 21, the exponent and sign calculator 22, the shifter 23, the adder 24, a LZA 26 (leading zero anticipator), and the exponent updater 28.

The configuration and the operation of the data converter 20b of FIG. 13 is similar to those of the data converter 20b of FIG. 7B. However, the function of the incrementing and shifting circuit 27 of FIG. 7B is identical or similar to the function of a combination of the shifter 23 and the adder 24, and thus the shifter 23 and the adder 24 may perform the function of the incrementing and shifting circuit 27. In the data converter 20b of FIG. 13, the shifter 23 may perform the shifting function of the incrementing and shifting circuit 27 shown in FIG. 7B, and the adder 24 may perform the incrementing function of the incrementing and shifting circuit 27 shown in FIG. 7B. As described above with reference to FIGS. 8A, 9A, and 12, when the data converter 20b performs one of a quantized FP to INT conversion, a dequantized INT to FP conversion, and an INT to FP conversion, the shifter 23 may receive the output R2 of the adder 24 and shift the output R2 of the adder 24 based on the shifting information SH provided from the LZA 26 and an exponent and a sign determined by the exponent and sign calculator 22. Therefore, the output R2 of the adder 24 may be normalized (and quantized), and a normalized output R3 may be output via the adder 24.

Figure 14:
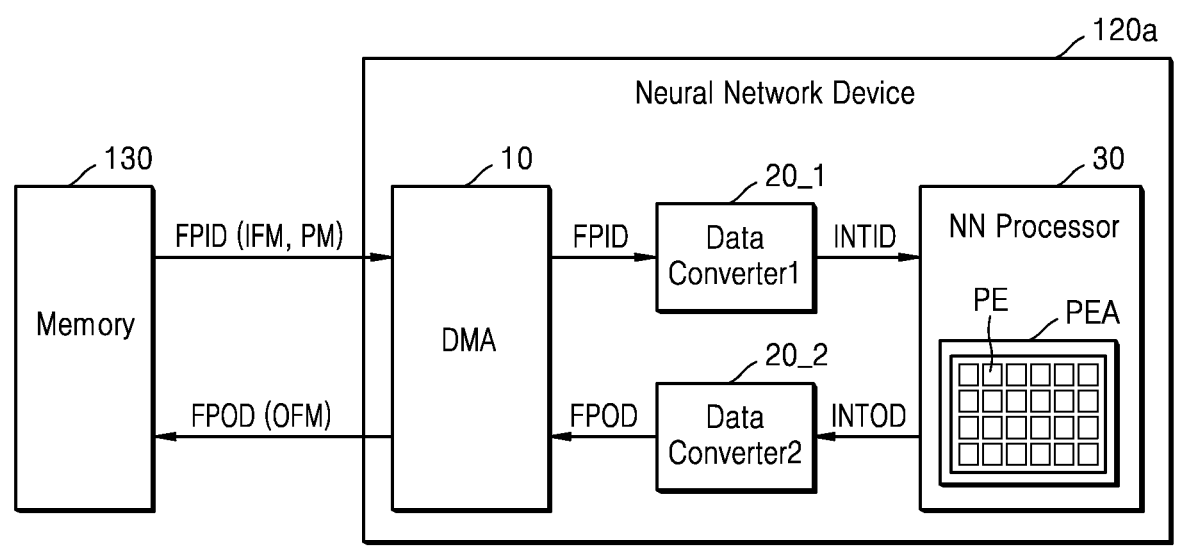
FIG. 14 is a block diagram showing a neural network device according to an example embodiment.

FIG. 14 is a block diagram showing a neural network device according to an example embodiment.

Referring to FIG. 14, a neural network device 120a may include the DMA controller 10, a first data converter 20_1, a second data converter 20_2, and the neural network processor 30. The functions of the DMA controller 10 and the neural network processor 30 are the same as those of the DMA controller 10 and the neural network processor 30 of FIG. 6. Therefore, descriptions already given above will be omitted.

In FIG. 14, the first data converter 20_1 may convert fixed-point input data FPID received through the DMA controller 10 to integer-type input data INTID. The first data converter 20_1 may provide the integer-type input data INTID to the neural network processor 30.

Also, the second data converter 20_2 may convert the integer-type output data INTOD output from the neural network processor 30 to the floating-point output data FPOD. The second data converter 20_2 may provide floating-point output data FPOD to the DMA controller 10.

The structures of the first data converter 20_1 and the second data converter 20_2 may be similar to those of the data converters 20, 20a, and 20b described with reference to FIGS. 7A, 7B and 13. However, the first data converter 20_1 may not include the exponent updater 28.

According to embodiments, the neural network device 120b may include multiple data converters. For example, the neural network device 120b may include multiple first data converters 20_1 and multiple second data converters 20_2. The number of the first data converters 20_1 and the number of the second data converters 20_2 may be set based on the processing speed of the neural network processor 30 and the bandwidth of the memory 130.

Figure 15:
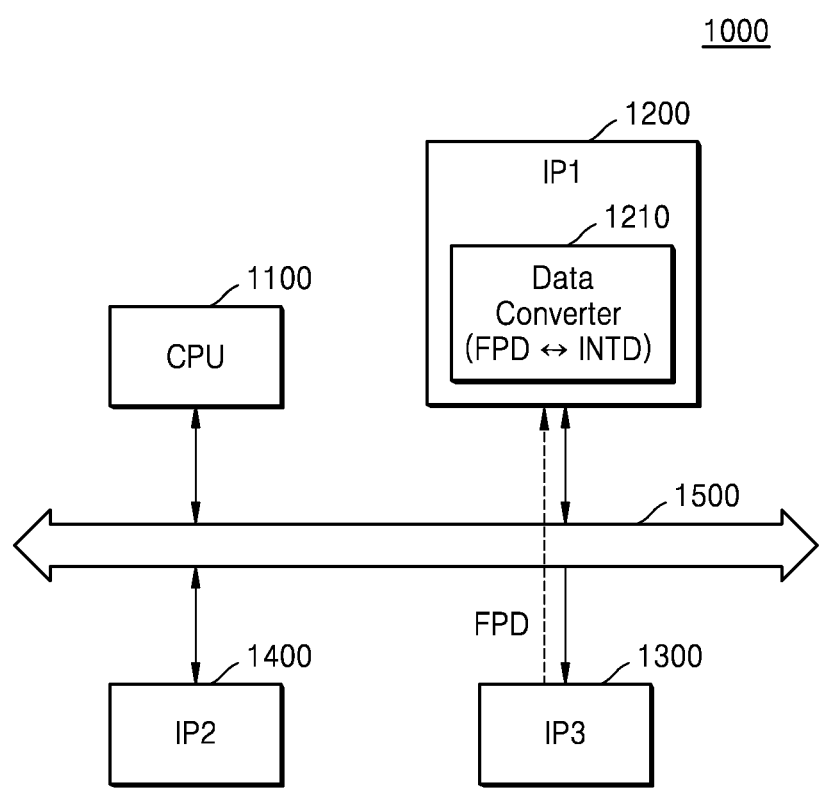
FIG. 15 is a block diagram illustrating a data processing system according to an example embodiment.

FIG. 15 is a block diagram illustrating a data processing system according to an example embodiment.

Referring to FIG. 15, a data processing system 1000 may include a CPU 1100 and multiple intellectual properties (IPs) including a first IP 1200, a second IP 1300, and a third IP 1400. The term "intellectual properties" and the acronym "IP" reference unique circuits that may each be separately subject to intellectual property protection. Thus, an intellectual property or IP may be referenced as an IP block, an IP circuit, or otherwise, but the term and the acronym serves as a convenience to reference circuits and circuitry that may be uniquely subject to specific intellectual property protection. The components (e.g., the CPU 1100 and the first IP 1200, the second IP 1300, and the third IP 1400) of the data processing system 1000 may exchange data with one another via a bus 1150. According to embodiments, the data processing system 1000 may be implemented as a system-on-chip (SoC).

The CPU 1100 controls the overall operation of the data processing system 1000 and each of the first IP 1200, the second IP 1300, and the third IP 1400 may perform a specific function in the data processing system 1000.

A first IP 1200 from among the first IP 1200, the second IP 1300, and the third IP 1400 may operate based on an integer operation or an integer processing. According to embodiments, the first IP 1200 may be an accelerator including one or more integer operators. The first IP 1200 may include a data converter 1210 that performs data conversion between floating-point data FPD and integer-type data INTD. The data converter 1210 may be implemented as the data converters 20, 20a, or 20b of FIGS. 7a, 7b, or 13 according to various embodiments described above. The data converter 1210 may convert the floating-point data FPD received from other components, e.g., the CPU 1100, a second IP 1300, and/or a third IP 1400, to the integer-type data INTD. A result of an operation of the first IP 1200 based on a input data, i.e., the integer-type data INTD may be output as a output data, i.e., the integer-type data INTD, and the data converter 1210 may convert the integer-type data INTD to the floating-point data FPD.

Although it has been described above that the first IP 1200 includes the data converter 1210 in the present embodiment, the IPs described herein are not limited thereto. According to embodiments, other IPs, e.g., the second IP 1300 and/or the third IP 1400 may also include the data converter 1210 to convert floating-point data FPD received from the outside to integer-type data INTD, to process the integer-type data INTD, or to perform integer operation. According to embodiments, at least one of the the second IP 1300 and the third IP 1400 may be a memory (e.g., DRAM, SRAM, etc).

Figure 16:
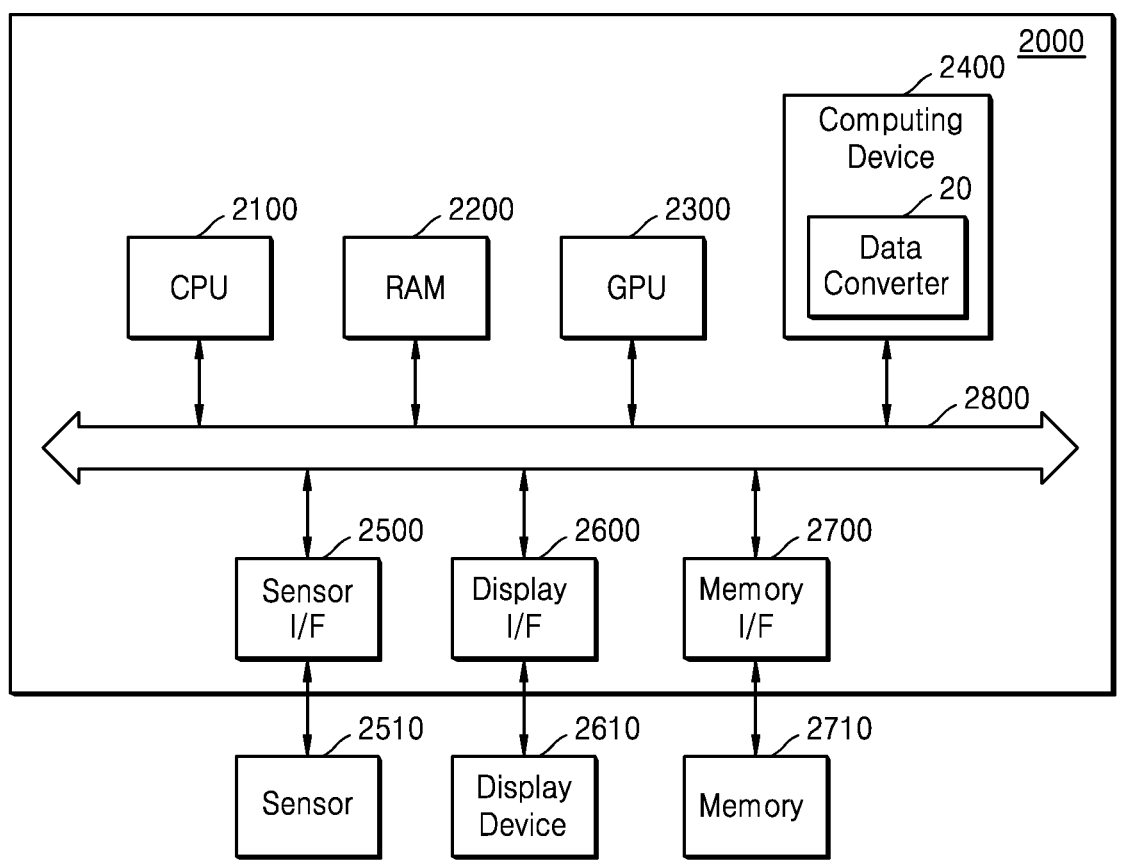
FIG. 16 is a block diagram showing an application processor according to an example embodiment.

FIG. 16 is a block diagram showing an application processor according to an example embodiment.

Referring to FIG. 16, an application processor 2000 may include a CPU 2100, RAM 2200 (random access memory), a GPU 2300, a computing device 2400, a sensor interface 2500, a display interface 2600, and a memory interface 2700. In addition, the application processor 2000 may further include a communication module. The components of the application processor 2000 (the CPU 2100, the RAM 2200, the GPU 2300, the computing device 2400, the sensor interface 2500, the display interface 2600, and the memory interface 2700) may transmit and receive data to/from one another via a bus 2800.

The CPU 2100 may control the overall operation of the application processor 2000. The CPU 2100 may include one processing core (single core) or multiple processing cores (multi-core). The CPU 2100 may process or execute programs and/or data stored in a memory 2710. According to an example embodiment, the CPU 2100 may control the functions of the computing device 2400 by executing programs stored in the memory 2710.

The RAM 2200 may temporarily store programs, data, and/or instructions. According to embodiments, the RAM 2200 may be implemented as dynamic RAM (DRAM) or static RAM (SRAM). The RAM 2200 may be input/output through the sensor interface 2500 and the display interface 2600 or may temporarily store images generated by the GPU 2300 or the CPU 2100.

According to embodiments, the application processor 2000 may include read-only memory (ROM). The ROM may store programs and/or data that are used continuously. The ROM may be implemented as erasable programmable ROM (EPROM) or electrically erasable/programmable ROM (EEPROM).

The GPU 2300 may perform image processing on image data. For example, the GPU 2300 may perform image processing on image data received via the sensor interface 2500. According to embodiments, the GPU 2300 may perform a floating-point operation.

Image data processed by the GPU 2300 may be stored in the memory 2710 or provided to a display device 2610 via the display interface 2600. Image data stored in the memory 2710 may be provided to the computing device 2400.

The sensor interface 2500 may interface data (e.g., image data, voice data, etc.) input from the sensor 2510 connected to the application processor 2000.

The display interface 2600 may interface data (e.g., images) output to the display device 2610. The display device 2610 may output data regarding images or videos through a display device, e.g., a liquid crystal display (LCD) or an active matrix organic light-emitting diode (AMO-LED).

The memory interface 2700 may interface data input from the memory 2710 outside the application processor 2000 or data output to the memory 2710. According to embodiments, the memory 2710 may be implemented as a volatile memory like DRAM or SRAM or a non-volatile memory like ReRAM, PRAM, or a NAND flash. The memory 2710 may be implemented as a memory card (e.g., MMC, eMMC, SD, micro SD, etc.), for example.

As described above with reference to FIGS. 1 to 14, the computing device 2400 may include the data converter 20 for performing data conversion between floating-point data and integer-type data, may convert input floating-point data to integer-type data, and convert a result of an integer operation based on the integer data, that is, integer data, to floating-point data. According to embodiments, the computing device 2400 may be a neural network device that performs neural network operations based on integer operations. For example, the computing device 2400 may be implemented as the neural network device 120 of FIG. 1. The computing device 2400 may perform data conversion internally when reading floating-point data from the memory 2710 and transmitting floating-point data to the memory 2710. Accordingly, the load of the CPU 2100 may be reduced, and the processing speed of the application processor 2000 may be improved. Also, since the computing device 2400 performs an integer operation, the power consumption may be reduced, and the accuracy of data processing results may be improved.

While the inventive concept(s) of the present disclosure have been particularly shown and described with reference to embodiments thereof, it will be understood that various changes in form and details may be made therein without departing from the spirit and scope of the following claims.

What is claimed is:

1. A neural network device for performing a neural network operation, the neural network device comprising:
 a direct memory access (DMA) controller configured to receive floating-point data from a memory through a bus;

a data converter configured to convert the floating-point data provided from the DMA controller to integer-type data; and a processor configured to perform a neural network operation based on an integer operation by using the integer-type data provided from the data converter.

2. The neural network device of claim 1, wherein the processor comprises a plurality of processing elements, each of which performs the integer operation.

3. The neural network device of claim 1, wherein the data converter performs a floating-point fused multiply-add (FMA) operation.

4. The neural network device of claim 1, wherein the data converter performs quantization and data conversion of input values based on two quantization parameters and the input values, and the two quantization parameters and the input values are floating-point numbers.

5. The neural network device of claim 4, wherein an output of the data converter is a quantized integer and a presence of a sign of the quantized integer and a number of data bits of the quantized integer are determined based on an operation code applied to the data converter.

6. The neural network device of claim 1, wherein the data converter converts integer-type output data output from the processor to floating-point output data.

7. The neural network device of claim 6, wherein the DMA controller provides the floating-point output data directly to the memory.

8. The neural network device of claim 6, wherein the data converter performs inverse quantization and data conversion on an output value of the integer-type data based on two quantization parameters and the output value, the two quantization parameters are floating-point numbers, and the output value is an integer.

9. The neural network device of claim 1, wherein the data converter comprises a plurality of floating-point operators and shifters, and at least some of the floating-point operators and the shifters are deactivated and the remaining ones are activated according to a received operation code to perform an operation mode according to the operation code.

10. The neural network device of claim 1, wherein the data converter comprises:
a shifter configured to output a first output and a second output; and
a floating-point fused multiply-add (FMA) circuit comprising an adder configured to generate a third output by summing the first output and the second output, wherein an output of the adder is provided to the shifter.

11. A method of operating a neural network device, the method comprising:
receiving, by a direct memory access (DMA) controller, floating-point input data from a memory through a bus;
converting, by a data converter, the floating-point input data provided from the DMA controller to integer-type input data; and
performing, by a processor, a neural network operation based on an integer operation by using the integer-type input data provided from the data converter.

12. The method of claim 11, wherein, in the receiving of the floating-point input data, the floating-point input data is received directly from the memory.

13. The method of claim 11, further comprising:
performing, based on two quantization parameters, quantization and conversion of an input value received as the floating-point input data, in the converting of the floating-point input data to integer-type input data.

14. The method of claim 11, wherein, the converting of the floating-point input data to integer-type input data is performed based on a first operation mode in which quantization and data conversion for the floating-point input data are performed and a second operation mode in which data conversion regarding the floating-point input data is performed, according to an operation code.

15. The method of claim 11, further comprising:
converting integer-type output data according to an operation result of the neural network operation to floating-point output data;
transmitting the floating-point output data to the memory; and
performing, based on two quantization parameters received as the floating-point input data, inverse quantization and data conversion of an output value of the floating-point output data, in the converting of the integer-type output data to floating-point output data.

16. An application processor, comprising:
a memory configured to store operation parameters and feature values, wherein the operation parameters and the feature values are floating-point type values; and
a neural network device configured to receive the operation parameters and the feature values from the memory, convert the operation parameters and the feature values to integer-type values, and perform a neural network operation based on the operation parameters and the feature values that are converted to integer-type values,
wherein the neural network device comprises:
a direct memory access (DMA) controller configured to received the operation parameters and the feature values, which are floating-type values, from the memory through a bus;
a data converter configured to convert the operation parameters and the feature values to the integer-type values; and
a neural network processor configured to perform the neural network operation by performing an integer operation based on the operation parameters and the feature values that are converted to the integer-type values.

17. The application processor of claim 16, wherein the neural network processor further comprises a direct memory access (DMA) controller configured to directly communicate with the memory and receive the operation parameters and the feature values, which are floating-point type values, from the memory.

18. The application processor of claim 16, wherein the data converter comprises:
a multiplier configured to multiply at least two inputs;
a first shifter configured to shift one of an output of the multiplier and one of other inputs based on exponents and signs of the at least two inputs and the remaining inputs;
an adder configured to sum two values output from the first shifter; and
a second shifter configured to shift an output of the adder based on a first shifting value provided based on a position of a preceding 1 included in the output of the adder and a second shifting value provided based on exponents and signs of the at least two inputs and the remaining inputs.

19. The application processor of claim 18, wherein the data converter deactivates at least one of the multiplier, the first shifter, the adder, and the second shifter according to an operating mode.

* * * * *